United States Patent
Yuan et al.

(10) Patent No.: US 10,062,696 B2
(45) Date of Patent: Aug. 28, 2018

(54) FIN FIELD EFFECT TRANSISTOR (FET) (FINFET) COMPLEMENTARY METAL OXIDE SEMICONDUCTOR (CMOS) CIRCUITS EMPLOYING SINGLE AND DOUBLE DIFFUSION BREAKS FOR INCREASED PERFORMANCE

(71) Applicant: QUALCOMM Incorporated, San Diego, CA (US)

(72) Inventors: Jun Yuan, San Diego, CA (US); Yanxiang Liu, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 15/197,949

(22) Filed: Jun. 30, 2016

(65) Prior Publication Data
US 2018/0006035 A1    Jan. 4, 2018

(51) Int. Cl.
*H01L 27/092*    (2006.01)
*H01L 29/06*    (2006.01)
(Continued)

(52) U.S. Cl.
CPC .... *H01L 27/0924* (2013.01); *H01L 21/02164* (2013.01); *H01L 21/28035* (2013.01);
(Continued)

(58) Field of Classification Search
IPC .................. H01L 27/0924,29/0649, 29/42376, 21/823821, 21/823878, 21/823828,
(Continued)

(56) References Cited

U.S. PATENT DOCUMENTS 8,878,309 B1    11/2014  Hong et al.
9,006,100 B2    4/2015   Rashed et al.
(Continued)

OTHER PUBLICATIONS

"Process Integration Technology, . . . ," by K. Okano et al., IEEE Explorer 2005.*
(Continued)

*Primary Examiner* — Hrayr A Sayadian
(74) *Attorney, Agent, or Firm* — Withrow & Terranova, PLLC

(57) ABSTRACT

Fin Field Effect Transistor (FET) (FinFET) complementary metal oxide semiconductor (CMOS) circuits with single and double diffusion breaks for increased performance are disclosed. In one aspect, a FinFET CMOS circuit employing single and double diffusion breaks includes a P-type FinFET that includes a first Fin formed from a semiconductor substrate and corresponding to a P-type diffusion region. The FinFET CMOS circuit includes an N-type FinFET that includes a second Fin formed from the semiconductor substrate and corresponding to an N-type diffusion region. To electrically isolate the P-type FinFET, first and second single diffusion break (SDB) isolation structures are formed in the first Fin on either side of a gate of the P-type FinFET. To electrically isolate the N-type FinFET, first and second double diffusion break (DDB) isolation structures are formed in the second Fin on either side of a gate of the N-type FinFET.

13 Claims, 19 Drawing Sheets

(51) Int. Cl.
  *H01L 29/423*    (2006.01)
  *H01L 21/8238*   (2006.01)
  *H01L 21/762*    (2006.01)
  *H01L 21/02*     (2006.01)
  *H01L 21/306*    (2006.01)
  *H01L 21/28*     (2006.01)
  *H01L 29/49*     (2006.01)

(52) U.S. Cl.
  CPC .. *H01L 21/30604* (2013.01); *H01L 21/76224* (2013.01); *H01L 21/823814* (2013.01); *H01L 21/823821* (2013.01); *H01L 21/823828* (2013.01); *H01L 21/823878* (2013.01); *H01L 29/0649* (2013.01); *H01L 29/42376* (2013.01); *H01L 29/4916* (2013.01)

(58) Field of Classification Search
  IPC .................. 21/02164, 21/30604, 21/28035, 29/4916, 21/823814, 21/76224
  See application file for complete search history.

(56) References Cited

U.S. PATENT DOCUMENTS

| | | |
|---|---|---|
| 9,263,516 B1 | 2/2016 | Wu et al. |
| 2015/0123211 A1 | 5/2015 | Zhang et al. |
| 2016/0043170 A1 | 2/2016 | Park et al. |
| 2016/0071848 A1 | 3/2016 | Sengupta et al. |
| 2016/0155741 A1 | 6/2016 | Yoo et al. |
| 2017/0062475 A1 | 3/2017 | Song et al. |

OTHER PUBLICATIONS

International Search Report and Written Opinion for PCT/US2017/039941, dated Sep. 26, 2017, 16 pages.

Pirzada, Usman, "TSMC is aiming for the 10nm Node by 2016—20nm Production to be Increased by Q3," WCCFTech, Jun. 25, 2014, 8 pages, http://wccftech.com/tsmc-aiming-10nm-node-2016-20nm-production-increased-q3/.

Wu, Shien-Yang et al., "A 16nm FinFET CMOS Technology for Mobile SoC and Computing Applications," 2013 IEEE International Electron Devices Meeting, Dec. 9-11, 2013, Washington, DC, IEEE, 4 pages.

\* cited by examiner

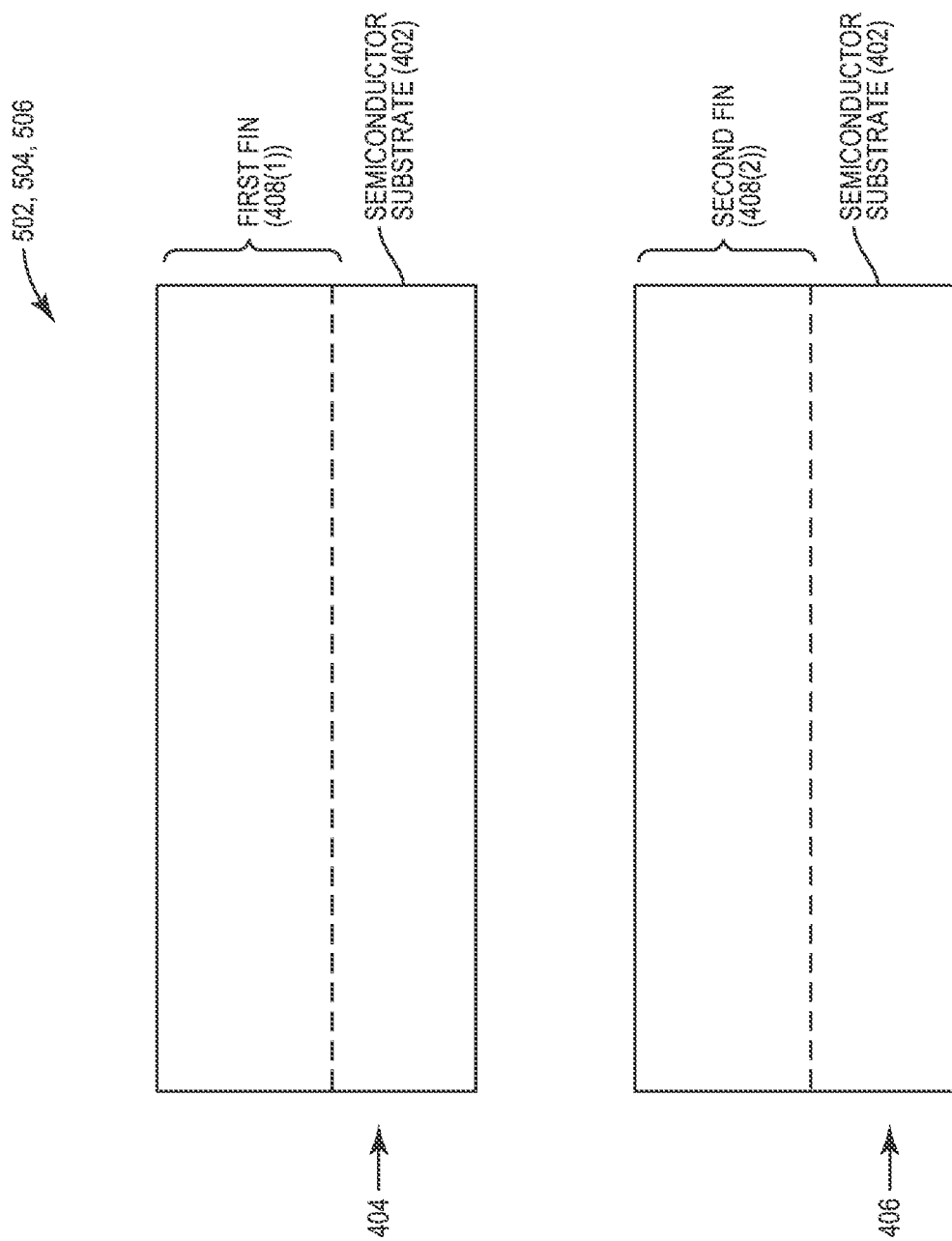

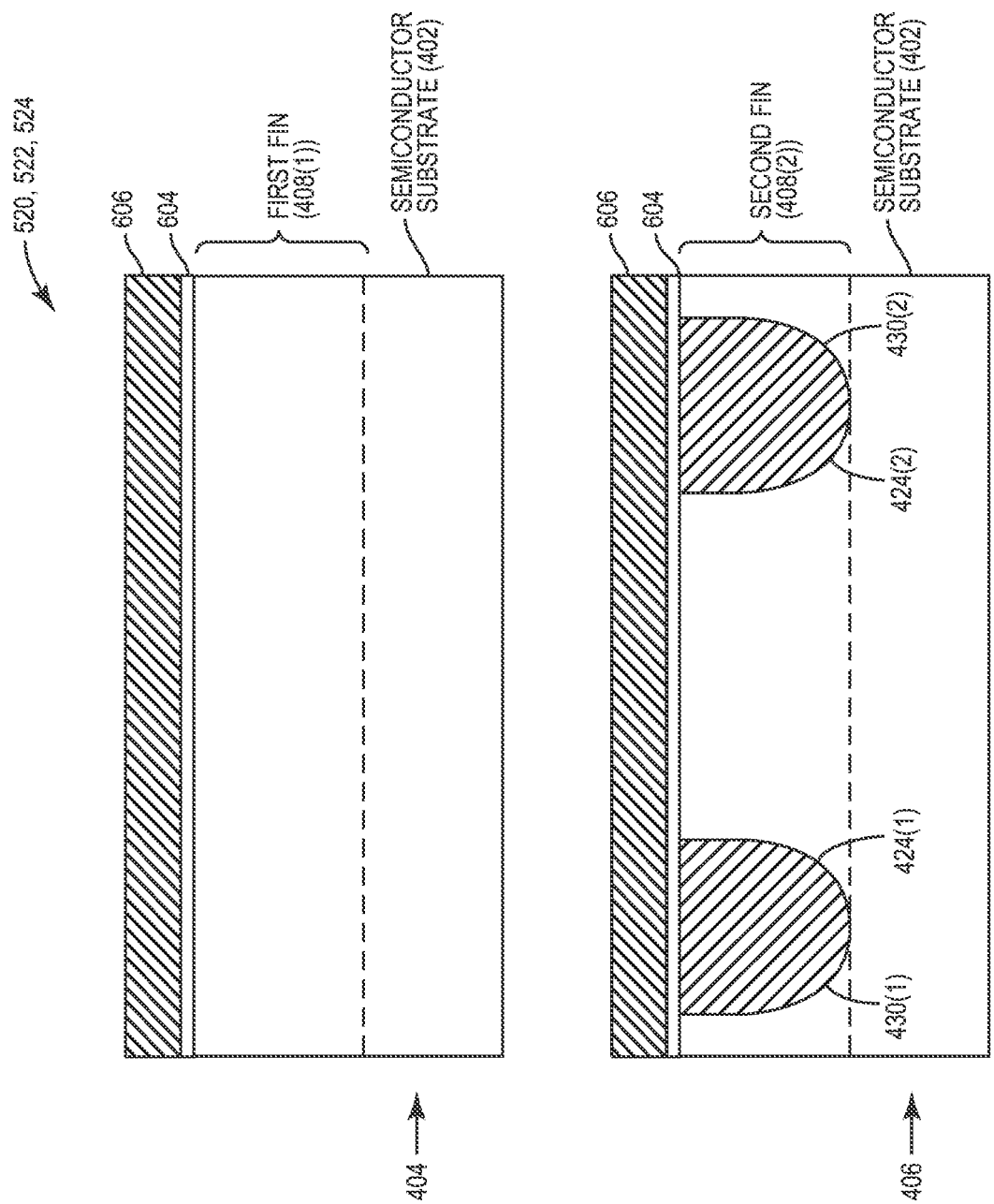

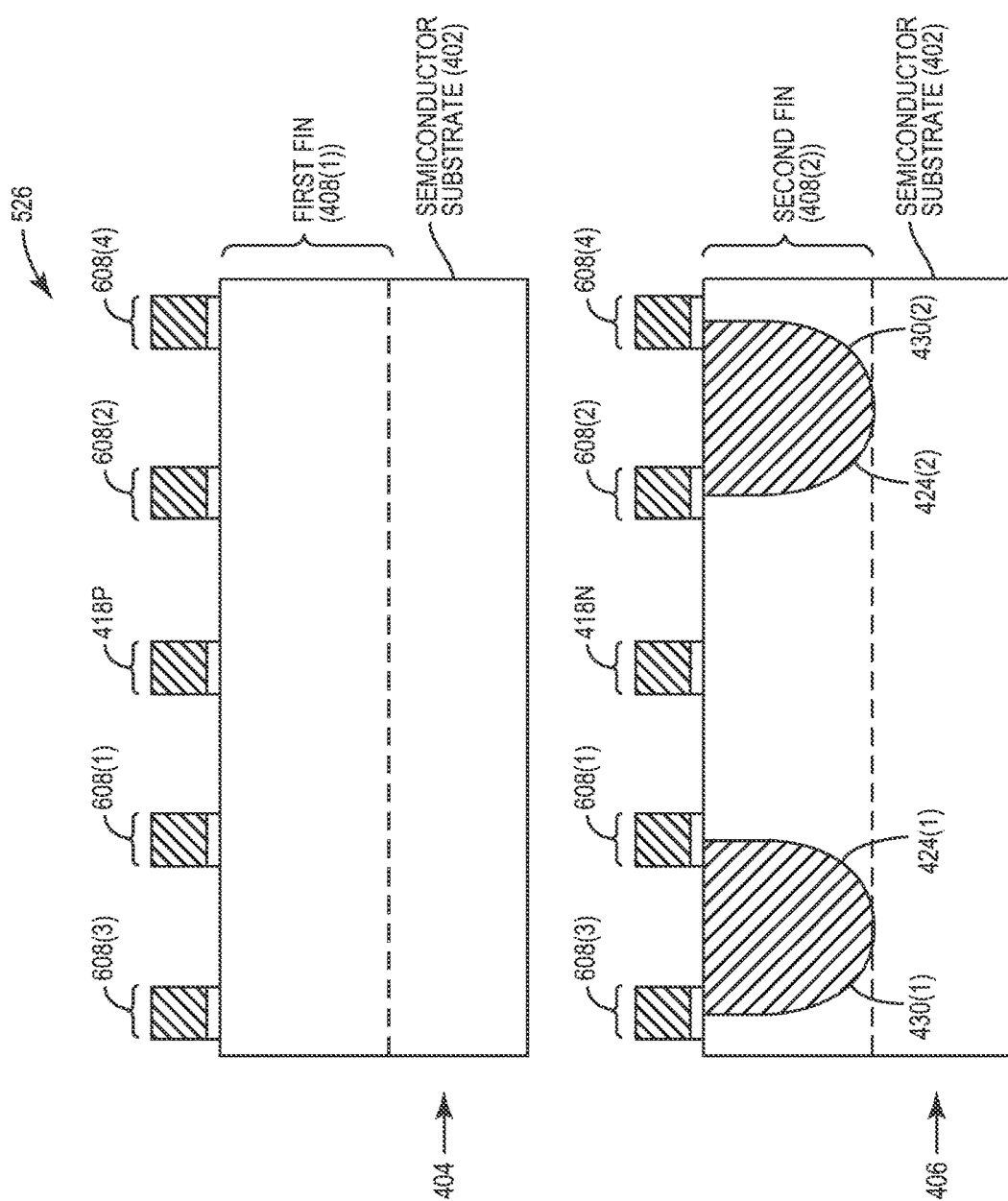

FIN FIELD EFFECT TRANSISTOR (FET) (FINFET) COMPLEMENTARY METAL OXIDE SEMICONDUCTOR (CMOS) CIRCUITS EMPLOYING SINGLE AND DOUBLE DIFFUSION BREAKS FOR INCREASED PERFORMANCE

BACKGROUND

I. Field of the Disclosure

The technology of the disclosure relates generally to Fin Field Effect Transistors (FETs) (FinFETs), and particularly to use of diffusion breaks between adjacent elements in FinFET complementary metal oxide semiconductor (CMOS) circuits to improve performance.

II. Background

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices.

As electronic devices become more complex in functionality, so does the need to include a greater number of transistors in such devices. However, as electronic devices are required to be provided in increasingly smaller packages, such as in mobile devices, for example, a greater number of transistors need to be provided in a smaller IC chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) and providing smaller parasitic capacitances resulting in reduced circuit delay. However, as channel length in planar transistors is reduced such that the channel length approaches a magnitude similar to the depletion layer widths, short channel effects (SCEs) can occur that degrade performance more specifically, SCEs in planar transistors cause increased current leakage, reduced threshold voltage, and/or threshold voltage roll-off (i.e., reduced threshold voltage at shorter gate lengths).

In this regard, to address the need to scale down channel lengths in transistors while avoiding or mitigating SCEs, transistor designs alternative to planar transistors have been developed. One such alternative transistor design includes a Fin Field Effect Transistor (FET) (FinFET) that provides a conducting channel via a "Fin" formed from a substrate. Material is wrapped around the Fin to form the gate of the device. For example, FIG. 1 illustrates a conventional FinFET 100. The FinFET 100 includes a semiconductor substrate 102 and a Fin 104 formed from the semiconductor substrate 102. An oxide layer 106 is included on either side of the Fin 104. The FinFET 100 includes a source 108 and a drain 110 interconnected by the Fin 104 such that an interior portion of the Fin 104 serves as a conduction channel 112 between the source 108 and drain 110. The Fin 104 is surrounded by a "wrap-around" gate 114. The wrap-around structure of the gate 114 provides better electrostatic control over the channel 112, and thus helps reduce the leakage current and overcome other SCEs.

Although a FinFET, such as the FinFET 100, reduces leakage current and avoids or mitigates SCEs compared to planar transistors, ICs employing FinFETs continue to need increased performance. For example, an IC can include one or more complementary metal oxide semiconductor (CMOS) circuits that employ P-type and N-type FinFETs. Conventional fabrication processes can result in P-type and N-type FinFETs having varying performance characteristics, such that either the P-type FinFET or the N-type FinFET limits the performance of a corresponding CMOS circuit, which limits the performance of the IC. In this manner, it would be advantageous to fabricate P-type and N-type FinFETs so as to reduce or avoid performance limitations attributable to conventional fabrication processes.

SUMMARY OF THE DISCLOSURE

Aspects disclosed herein include Fin Field Effect Transistor (FET) (FinFET) complementary metal oxide semiconductor (CMOS) circuits employing single and double diffusion breaks for increased performance. In one aspect, a FinFET CMOS circuit employing single and double diffusion breaks is provided. The FinFET CMOS circuit includes a P-type FinFET that includes a first Fin formed from a semiconductor substrate and corresponding to a P-type semiconductor material (P-type) diffusion region. The FinFET CMOS circuit also includes an N-type FinFET that includes a second Fin formed from the semiconductor substrate and corresponding to an N-type semiconductor material (N-type) diffusion region. To electrically isolate the P-type FinFET, first and second single diffusion break (SDB) isolation structures are formed in the first Fin on either side of a gate of the P-type FinFET. To electrically isolate the N-type FinFET, first and second double diffusion break (DDB) isolation structures are formed in the second Fin on either side of a gate of the N-type FinFET. Employing SDB and DDB isolation structures allows the P-type FinFET and the N-type FinFET to each achieve increased performance. For example, P-type FinFETs can achieve better performance in response to stress applied using a SDB isolation structure, while N-type FinFETs can achieve better performance in response to stress applied using a DDB isolation structure. Further, the SDB and DDB isolation structures can be formed using conventional processes, such that the FinFET CMOS circuit achieves increased performance while avoiding increased fabrication costs and complexity.

In this regard in one aspect, a FinFET CMOS circuit is provided. The FinFET CMOS circuit comprises a semiconductor substrate. The FinFET CMOS circuit also comprises a P-type FinFET comprising a first Fin formed from the semiconductor substrate and corresponding to a P-type diffusion region. The FinFET CMOS circuit also comprises an N-type FinFET comprising a second Fin formed from the semiconductor substrate and corresponding to an N-type diffusion region. The FinFET CMOS circuit also comprises a first SDB isolation structure formed in the first Fin on a first side of a gate of the P-type FinFET. The FinFET CMOS circuit also comprises a second SDB isolation structure formed in the first Fin on a second side of the gate of the P-type FinFET opposite of the first side of the gate of the P-type FinFET. The FinFET CMOS circuit also comprises a first DDB isolation structure formed in the second Fin on a first side of a gate of the N-type FinFET. The FinFET CMOS circuit also comprises a second DDB isolation structure formed in the second Fin on a second side of the gate of the N-type FinFET opposite of the first side of the gate of the N-type FinFET.

In another aspect, a method of fabricating a FinFET CMOS circuit with single and double diffusion breaks is provided. The method comprises providing a semiconductor substrate comprising a first Fin corresponding to a P-type diffusion region of the semiconductor substrate, and a second Fin corresponding to an N-type diffusion region of the semiconductor substrate. The method also comprises forming a first DDB isolation structure in the second Fin. The method also comprises forming a second DDB isolation structure in the second Fin. The method also comprises forming a P-type FinFET comprising the first Fin and an N-type FinFET comprising the second Fin such that a gate of the N-type FinFET is disposed between the first DDB isolation structure and the second DDB isolation structure. The method also comprises forming a first SDB isolation structure in the first Fin on a first side of a gate of the P-type FinFET. The method also comprises forming a second SDB isolation structure in the first Fin on a second side of the gate of the P-type FinFET opposite of the first side of the gate of the P-type FinFET.

BRIEF DESCRIPTION OF THE FIGURES

FIGS. 6A-6I are cross-sectional diagrams illustrating the FinFET CMOS circuit in FIGS. 4A and 4B at each step in the process of fabrication in FIGS. 5A-5C;

DETAILED DESCRIPTION

Figure 1:
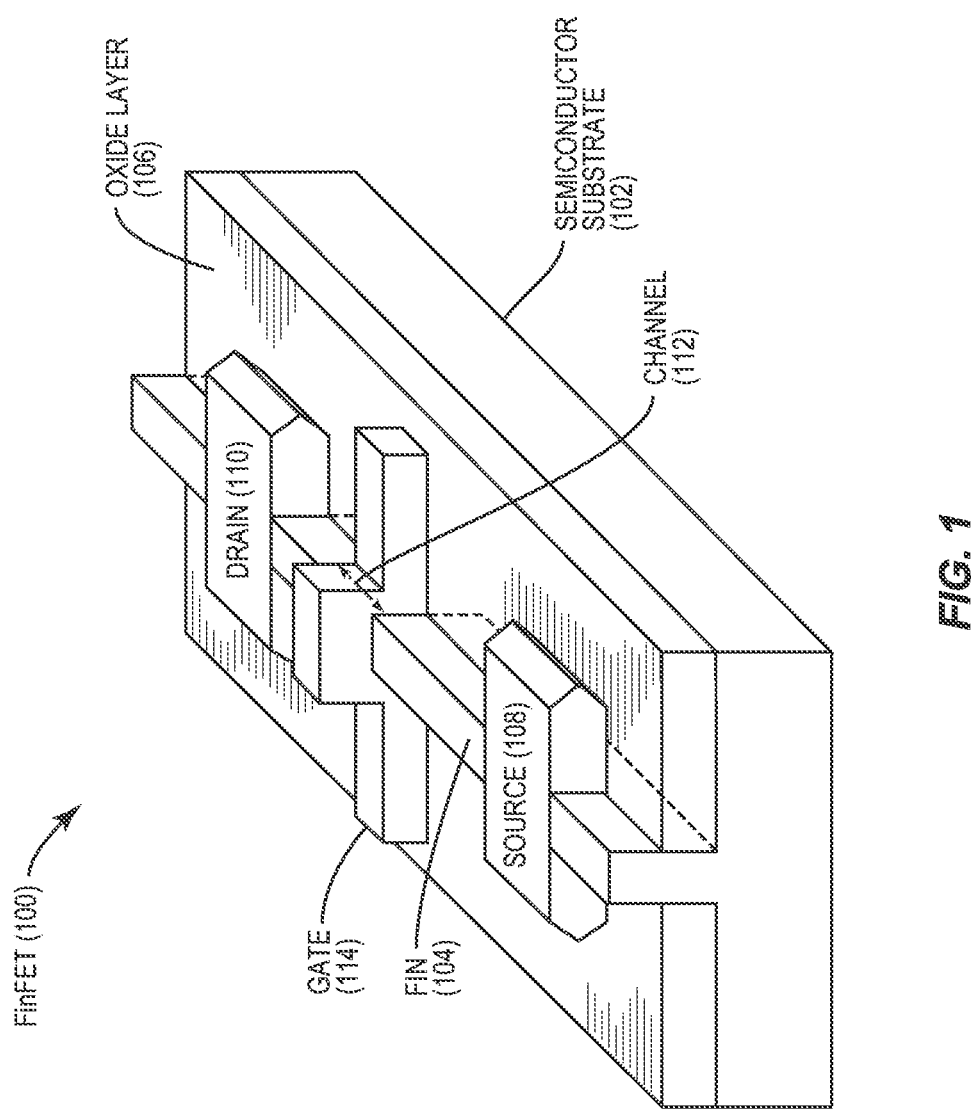
FIG. 1 is a perspective diagram of a conventional Fin Field Effect Transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include Fin Field Effect Transistor (FET) (FinFET) complementary metal oxide semiconductor (CMOS) circuits employing single and double diffusion breaks for increased performance. In one aspect, a FinFET CMOS circuit employing single and double diffusion breaks is provided. The FinFET CMOS circuit includes a P-type FinFET that includes a first Fin formed from a semiconductor substrate and corresponding to a P-type semiconductor material (P-type) diffusion region. The FinFET CMOS circuit also includes an N-type FinFET that includes a second Fin formed from the semiconductor substrate and corresponding to an N-type semiconductor material (N-type) diffusion region. To electrically isolate the P-type FinFET, first and second single diffusion break (SDB) isolation structures are formed in the first Fin on either side of a gate of the P-type FinFET. To electrically isolate the N-type FinFET, first and second double diffusion break (DDB) isolation structures are formed in the second Fin on either side of a gate of the N-type Employing SDB and DDB isolation structures allows the P-type FinFET and the N-type FinFET to each achieve increased performance. For example, P-type FinFETs can achieve better performance in response to stress applied using a SDB isolation structure, while N-type FinFETs can achieve better performance in response to stress applied using a DDB isolation structure. Further, the SDB and DDB isolation structures can be formed using conventional processes, such that the FinFET CMOS circuit achieves increased performance while avoiding increased fabrication costs and complexity.

Figure 4A:
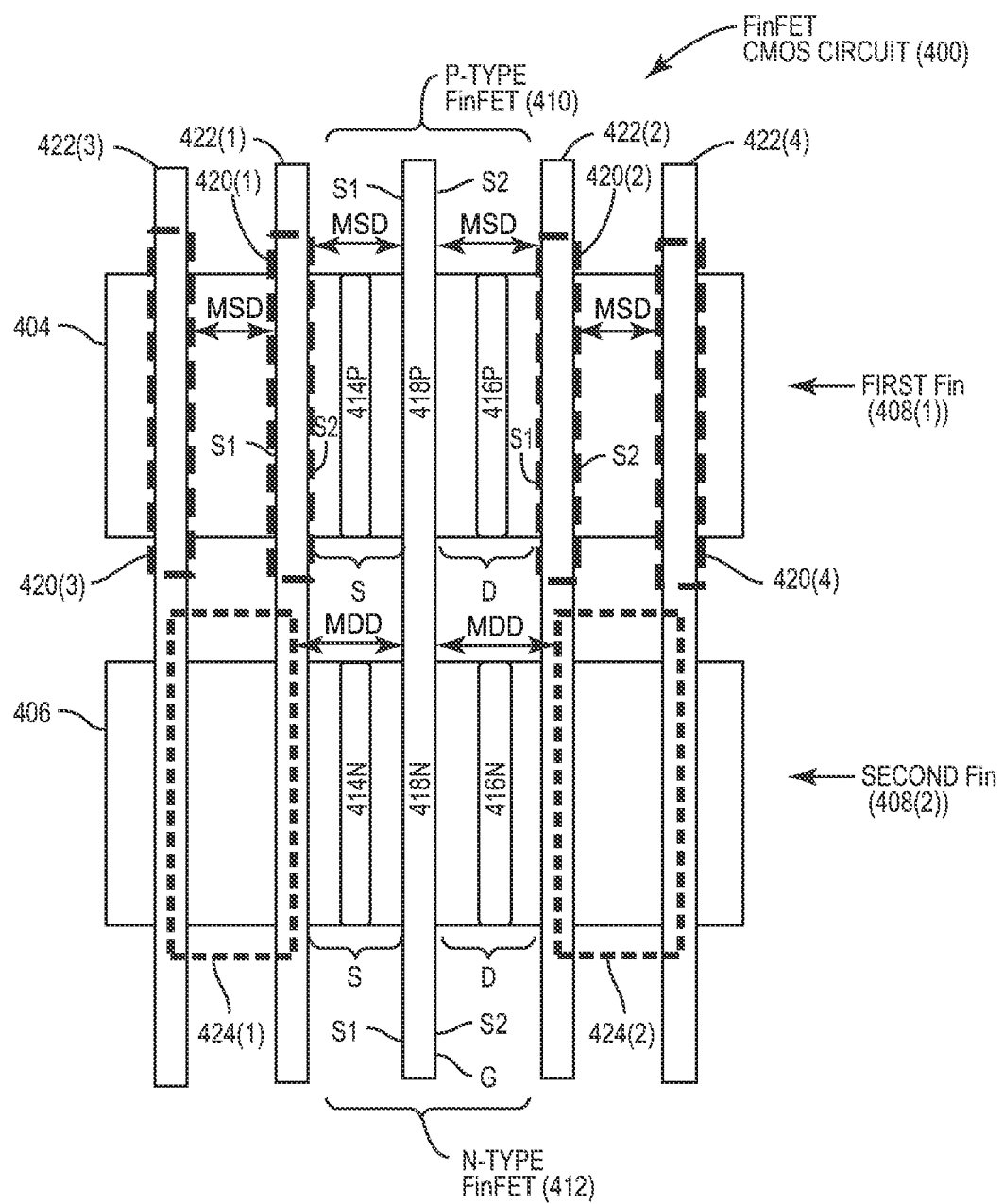
FIG. 4A is a top-view diagram of an exemplary FinFET CMOS circuit employing SDB isolation structures corresponding to P-type FinFETs, and DDB isolation structures corresponding to N-type FinFETs for increased performance.

Before discussing exemplary FinFET CMOS circuits employing single and double diffusion breaks for increased performance starting at FIG. 4A, exemplary conventional FinFET CMOS circuits with uniform diffusion breaks are first described.

Figure 2:
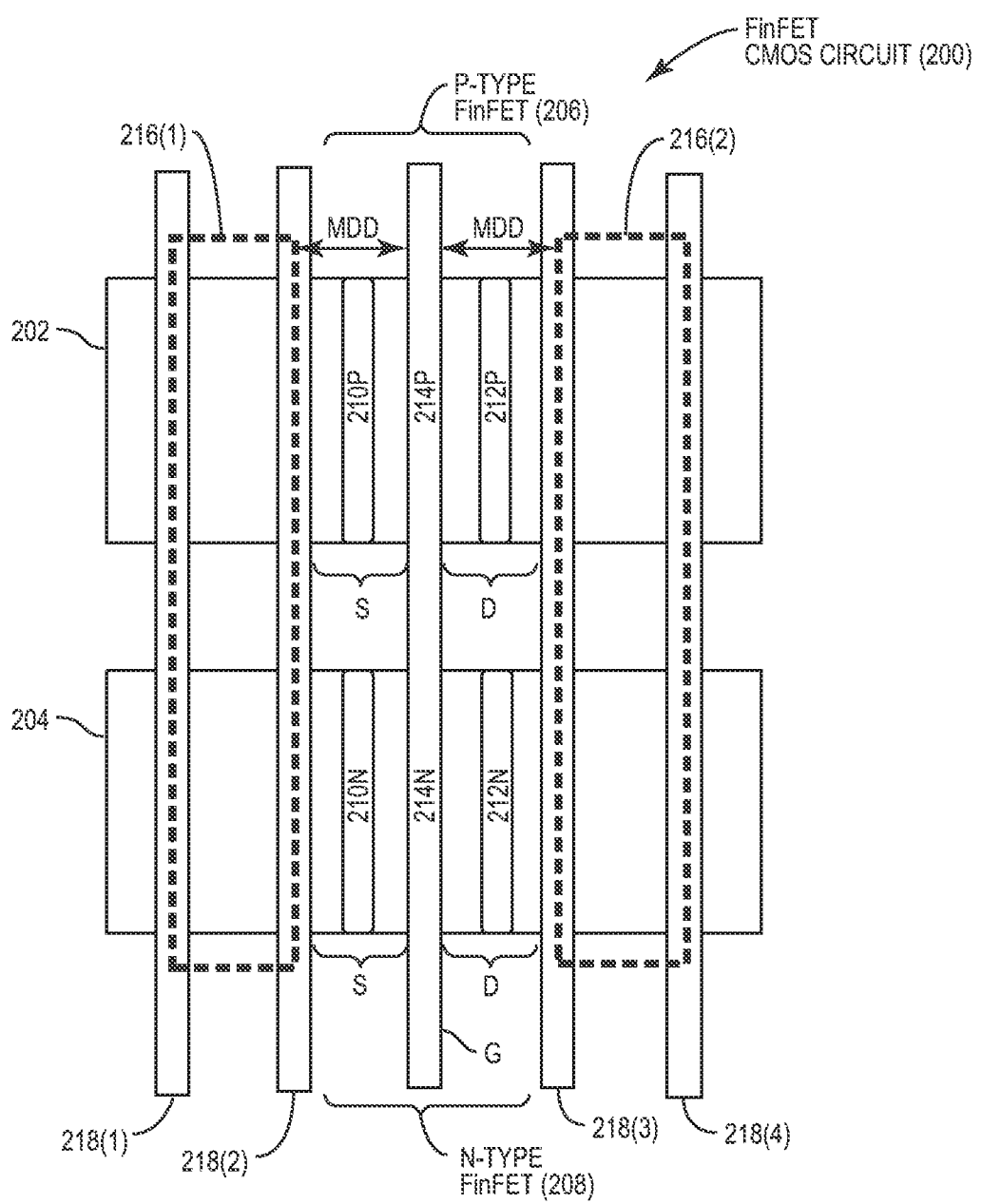
FIG. 2 is a top-view diagram of a conventional FinFET complementary metal oxide semiconductor (CMOS) circuit employing double diffusion break (DDB) isolation structures for FinFET isolation.

FIG. 2 illustrates a conventional FinFET CMOS circuit 200 employing DDB isolation structures for FinFET isolation. In particular, the FinFET CMOS circuit 200 includes a P-type diffusion region 202 and an N-type diffusion region 204. The FinFET CMOS circuit 200 also includes a P-type FinFET 206 corresponding to the P-type diffusion region 202, and an N-type FinFET 208 corresponding to the N-type diffusion region 204. The P-type FinFET 206 includes a source contact 210P corresponding to a source S, a drain contact 212P corresponding to a drain D, and a gate 214P. Similarly, the N-type FinFET 208 includes a source contact 210N corresponding to a source S, a drain contact 212N corresponding to a drain D, and a gate 214N. In this example, the gates 214P, 214N correspond to a common gate G shared between the P-type FinFET 206 and the N-type FinFET 208.

With continuing reference to FIG. 2, to electrically isolate the P-type FinFET 206 and the N-type FinFET 208 from other elements in the P-type and N-type diffusion regions 202, 204, respectively, the FinFET CMOS circuit 200 employs first and second DDB isolation structures 216(1), 216(2). The first DDB isolation structure 216(1) is formed across the P-type and N-type diffusion regions 202, 204. In particular, the first DDB isolation structure 216(1) is formed a minimum DDB distance MDD from the gates 214P, 214N, and is formed in an area bounded by inactive gates 218(1), 218(2). The minimum DDB distance MDD is the minimum distance that must be maintained between DDB regions and transistor gates according to a corresponding process technology. In this example, the minimum DDB distance is approximately equal to a gate pitch minus one-half a gate length. The second DDB isolation structure 216(2) is formed the minimum DDB distance MDD from the gates 214P, 214N, and is formed in an area bounded by inactive gates 218(3), 218(4) opposite of the first DDB isolation structure 216(1). Forming the first and second DDB isolation structures 216(1), 216(2) the minimum DDB distance MDD from the gates 214P, 214N helps to minimize area consumption of the FinFET CMOS circuit 200. However, employing the first and second DDB isolation structures 216(1), 216(2) for both the P-type and N-type FinFETs 206, 208 limits the performance of the FinFET CMOS circuit 200.

As discussed starting at FIG. 4A, aspects disclosed herein include FinFET CMOS circuits that include single and double diffusion breaks for increased performance. In particular, P-type FinFETs can achieve better performance in response to stress applied using a SDB isolation structure, while N-type FinFETs can achieve better performance in response to stress applied using a DDB isolation structure.

Figure 3A:
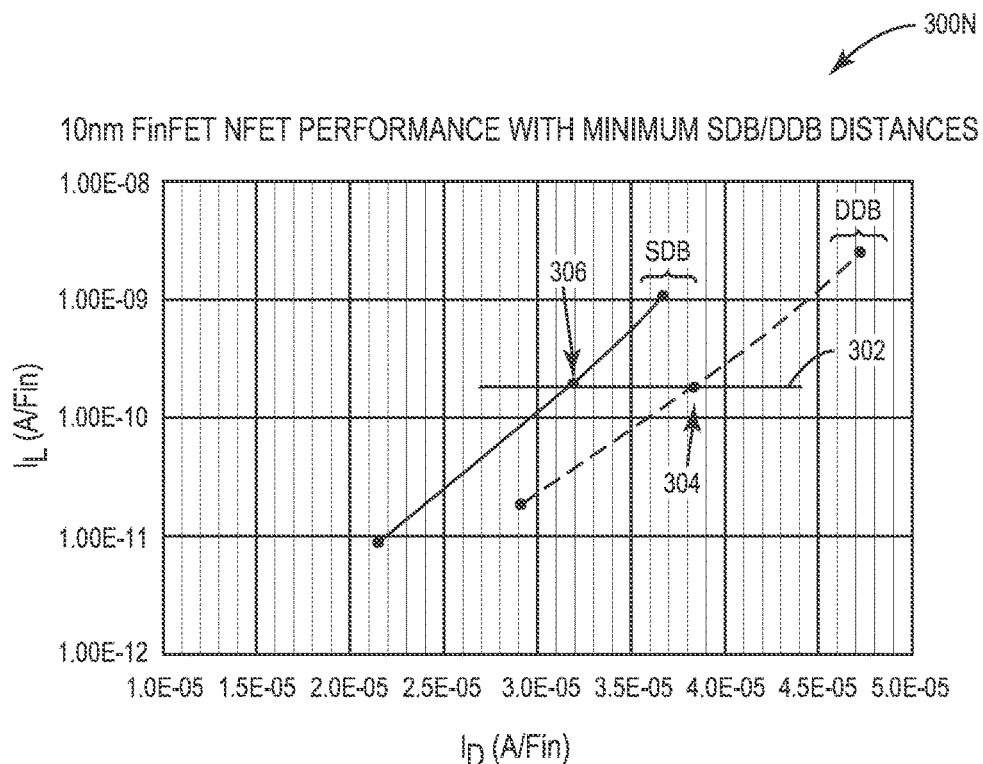
FIG. 3A is a graph illustrating drive current versus leakage current corresponding to N-type FinFETs isolated by DDB isolation structures and single diffusion break (SDB) isolation structures.
Figure 3B:
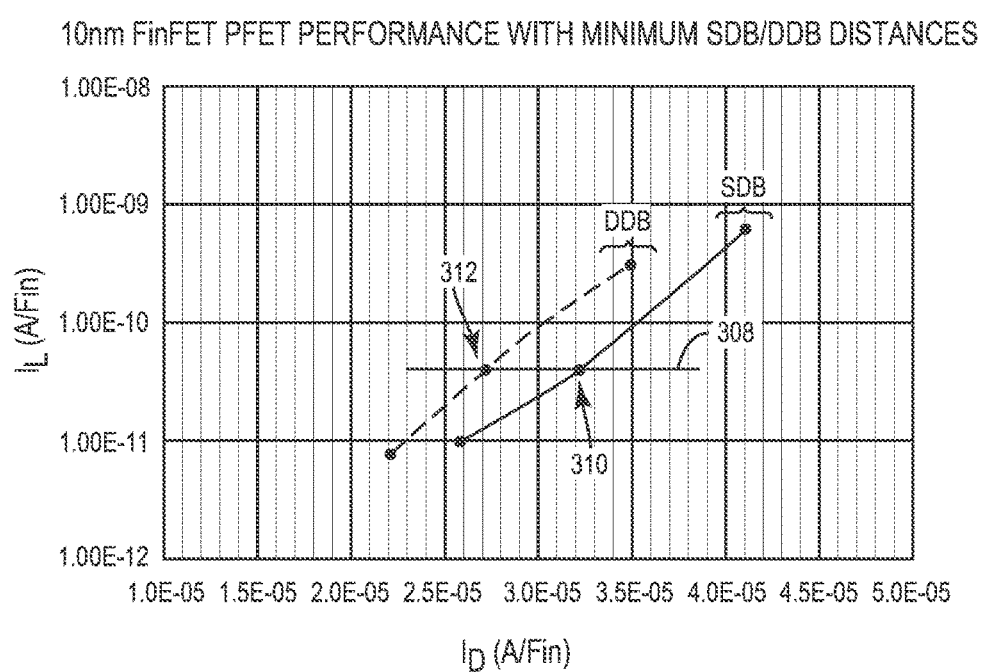
FIG. 3B is a graph illustrating drive current versus leakage current corresponding to P-type FinFETs isolated by DDB isolation structures and SDB isolation structures.

In this regard, FIGS. 3A and 3B include graphs 300N, 300P, respectively, illustrating drive current ($I_D$) versus leakage current ($I_L$) of exemplary ten (10) nanometer (nm) N-type and P-type FinFETs isolated by exemplary DDB and SDB isolation structures. With reference to the graph 300N, employing DDB isolation structures corresponds to N-type FinFETs having a higher drive current ($I_D$) to leakage current ($I_L$) ratio compared to employing SDB isolation structures. For example, at a particular leakage current ($I_L$) value (line 302), an N-type FinFET corresponding to DDB isolation structures has a higher drive current ($I_D$) (arrow 304) compared to a lower drive current ($I_D$) (arrow 306) of an N-type FinFET corresponding to SDB isolation structures. Conversely, with reference to the graph 300P, at a particular leakage current ($I_L$) value (line 308), a P-type FinFET corresponding to SDB isolation structures has a higher drive current ($I_D$) (arrow 310) compared to a lower drive current ($I_D$) (arrow 312) of a P-type FinFET corresponding to DDB isolation structures. Such differences in the drive current ($I_D$) to leakage current ($I_L$) ratio can be attributed, in part, to differing channel stress properties between SDB and DDB isolation structures. Thus, in this example, P-type FinFETs can achieve better performance in response to stress applied using SDB isolation structures, while N-type FinFETs can achieve better performance in response to stress applied using DDB isolation structures.

Figure 4B:
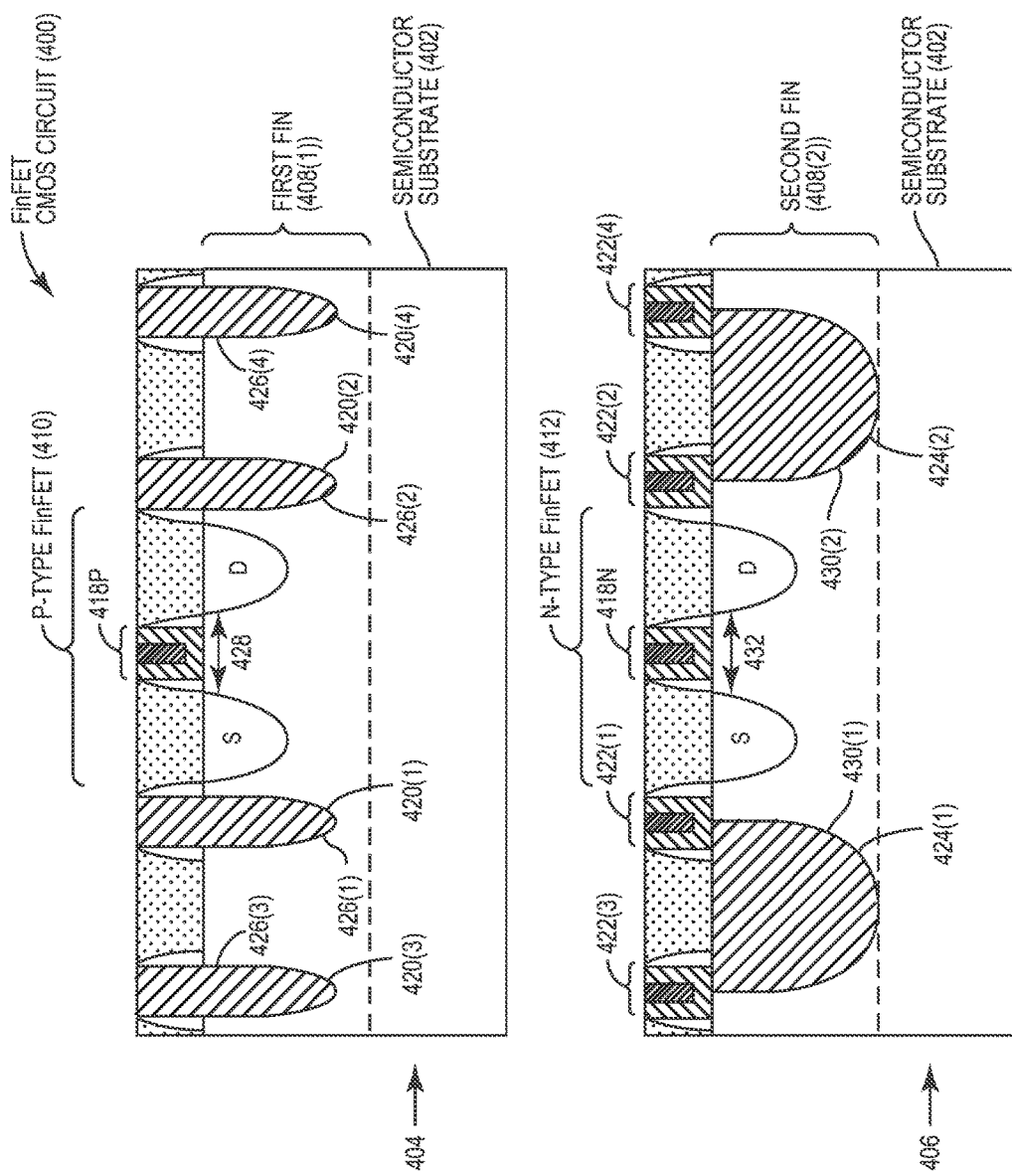
FIG. 4B is a cross-sectional diagram of the exemplary FinFET CMOS circuit in FIG. 4A.

In this regard, FIG. 4A illustrates a top-view diagram of an exemplary FinFET CMOS circuit 400 employing single and double diffusion breaks for increased performance. FIG. 4B illustrates a cross-sectional diagram of the FinFET CMOS circuit 400. Components of the FinFET CMOS circuit 400 are referred to with common elements numbers in FIGS. 4A and 4B. However, some components illustrated in FIG. 4A are not illustrated in FIG. 4B, and vice versa, due to the differences between top-view and cross-sectional view diagrams.

With continuing reference to FIGS. 4A and 4B, the FinFET CMOS circuit 400 includes a semiconductor substrate 402 having a P-type diffusion region 404 and an N-type diffusion region 406. A first Fin 408(1) is formed from the semiconductor substrate 402 corresponding to the P-type diffusion region 404. A second Fin 408(2) is formed from the semiconductor substrate 402 corresponding to the N-type diffusion region 406. Additionally, the FinFET CMOS circuit 400 includes a P-type FinFET 410 that includes the first Fin 408(1), and an N-type FinFET 412 that includes the second Fin 408(2). The P-type FinFET 410 includes a source contact 414P corresponding to a source S, a drain contact 416P corresponding to a drain D, and a gate 418P. Similarly, the N-type FinFET 412 includes a source contact 414N corresponding to a source S, a drain contact 416N corresponding to a drain D, and a gate 418N. In this example, the gates 418P, 418N correspond to a common gate G shared between the P-type FinFET 410 and the N-type FinFET 412.

With continuing reference to FIGS. 4A and 4B, the FinFET CMOS circuit 400 employs single and double diffusion breaks to electrically isolate the P-type FinFET 410 and the N-type FinFET 412 from other circuit elements, such as, for example, other P-type and N-type FinFETs, respectively. In this manner, the FinFET CMOS circuit 400 includes first and second SDB isolation structures 420(1), 420(2) formed in the first Fin 408(1). In this aspect, the first SDB isolation structure 420(1) is formed a first defined distance from a first side S1 of the gate 418P of the P-type FinFET 410, and the second SDB isolation structure 420(2) is formed the first defined distance from a second side S2 of the gate 418P opposite of the first side S1 of the gate 418P. As a non-limiting example, the first defined distance is equal to a minimum SDB distance MSD that must be maintained between SDB regions and transistor gates according to a corresponding process technology. In this example, the minimum SDB distance MSD is approximately equal to the gate pitch minus the gate length. For example, a conventional 10 nm process technology may be employed to fabricate the FinFET CMOS circuit 400 such that the P-type FinFET 410 and the N-type FinFET 412 each have a gate length approximately between fifteen (15) nm and twenty (20) nm, while a gate pitch is approximately equal to sixty-four (64) nm. Thus, in a conventional 10 nm process technology with a gate length approximately equal to 20 nm, the minimum SDB distance MSD is approximately equal to forty-four (44) nm, for example. Further, in this example, the first and second SDB isolation structures 420(1), 420(2) each align with a corresponding inactive gate 422(1), 422(2). Such alignment results in the first and second SDB isolation structures 420(1), 420(2) each having a width approximately equal to a gate length of the P-type FinFET 410. The FinFET CMOS circuit 400 also includes third and fourth SDB isolation structures 420(3), 420(4) aligned with inactive gates 422(3), 422(4), respectively. In this aspect, the third SDB isolation structure 420(3) is formed the first defined distance (e.g., MSD) from a first side S1 of the first SDB isolation structure 420(1) opposite of a second side S2 of the first SDB isolation structure 420(1) on which the gate 418P of the P-type FinFET 410 is formed. The fourth SDB isolation structure 420(4) is formed the first defined distance (e.g., MSD) from a second side S2 of the second SDB isolation structure 420(2) opposite of a first side S1 of the second SDB isolation structure 420(2) on which the gate 418P is formed.

With continuing reference to FIGS. 4A and 4B, to electrically isolate the N-type FinFET 412, first and second DDB isolation structures 424(1), 424(2) are formed in the second Fin 408(2). In this aspect, the first DDB isolation structure 424(1) is formed a second defined distance from a first side S1 of the gate 418N of the N-type FinFET 412. For example, the second defined distance is equal to the minimum DDB distance MDD. As previously described the minimum DDB distance MDD is approximately equal to a gate pitch minus one-half a gate length. Thus, in a conventional 10 nm process technology with a gate length approximately equal to 20 nm, the minimum DDB distance MDD is approximately equal to fifty-four (54) nm, for example. Further, the second DDB isolation structure 424(2) is formed the second defined distance (e.g., MDD) from a second side S2 of the gate 418N opposite of the first side S1 of the gate 418N. In this example, the first DDB isolation structure 424(1) aligns with a center line of each inactive gate 422(1), 422(3), while the second DDB isolation structure 424(2) aligns with a center line of each inactive gate 422(2), 422(4). The inactive gates 422(1), 422(3) are separated from each other by the minimum SDB distance MSD, as are the inactive gates 422(2), 422(4). Such alignment results in the first and second DDB isolation structures 424(1), 424(2) each having a width approximately equal to one (1) gate length of the N-type FinFET 412 plus the minimum SDB distance MSD (e.g., a gate pitch).

With particular reference to FIG. 4B, and as discussed in more detail below, the first SDB isolation structure 420(1) is formed by etching a first SDB trench 426(1) into the first Fin 408(1), and filling the first SDB trench 426(1) with an SDB dielectric material. Similarly, the second SDB isolation structure 420(2) is formed by etching a second SDB trench 426(2) into the first Fin 408(1), and filling the second SDB trench 426(2) with the SDB dielectric material. For example, the first and second SDB isolation structures 420(1), 420(2) can be formed using shallow trench isolation (STI) processes. The SDB dielectric material may include, for example, silicon dioxide. Further, the first DDB isolation structure 424(1) is formed by etching a first DDB trench 430(1) into the second Fin 408(2), and filling the first DDB trench 430(1) with a DDB dielectric material. Similarly, the second DDB isolation structure 424(2) is formed by etching a second DDB trench 430(2) into the second Fin 408(2), and filling the second DDB trench 430(2) with the DDB dielectric material. For example, the first and second DDB isolation structures 424(1), 424(2) can be formed using deep STI processes. The DDB dielectric material may include, for example, silicon dioxide.

Employing single and double diffusion regions in the FinFET CMOS circuit 400 by forming both the first and second SDB isolation structures 420(1), 420(2) and the first and second DDB isolation structures 424(1), 424(2) as described above allows the P-type FinFET 410 and the N-type FinFET 412 to each achieve increased performance without increasing area. In particular, forming the first and second SDB isolation structures 420(1), 420(2) and the first and second DDB isolation structures 424(1), 424(2) using the minimum DDB and SDB distances MDD, MSD, respectively, minimizes the area consumption of the FinFET CMOS circuit 400. Additionally, the first and second SDB isolation structures 420(1), 420(2) and the first and second DDB isolation structures 424(1), 424(2) can be used to apply stress to the P-type FinFET 410 and the N-type FinFET 412, respectively, which increases the performance of the FinFET CMOS circuit 400. Further, the first and second SDB isolation structures 420(1), 420(2) and the first and second DDB isolation structures 424(1), 424(2) can be formed using conventional processes, such that the FinFET CMOS circuit 400 achieves increased performance while avoiding increased fabrication costs and complexity.

Figure 5A:
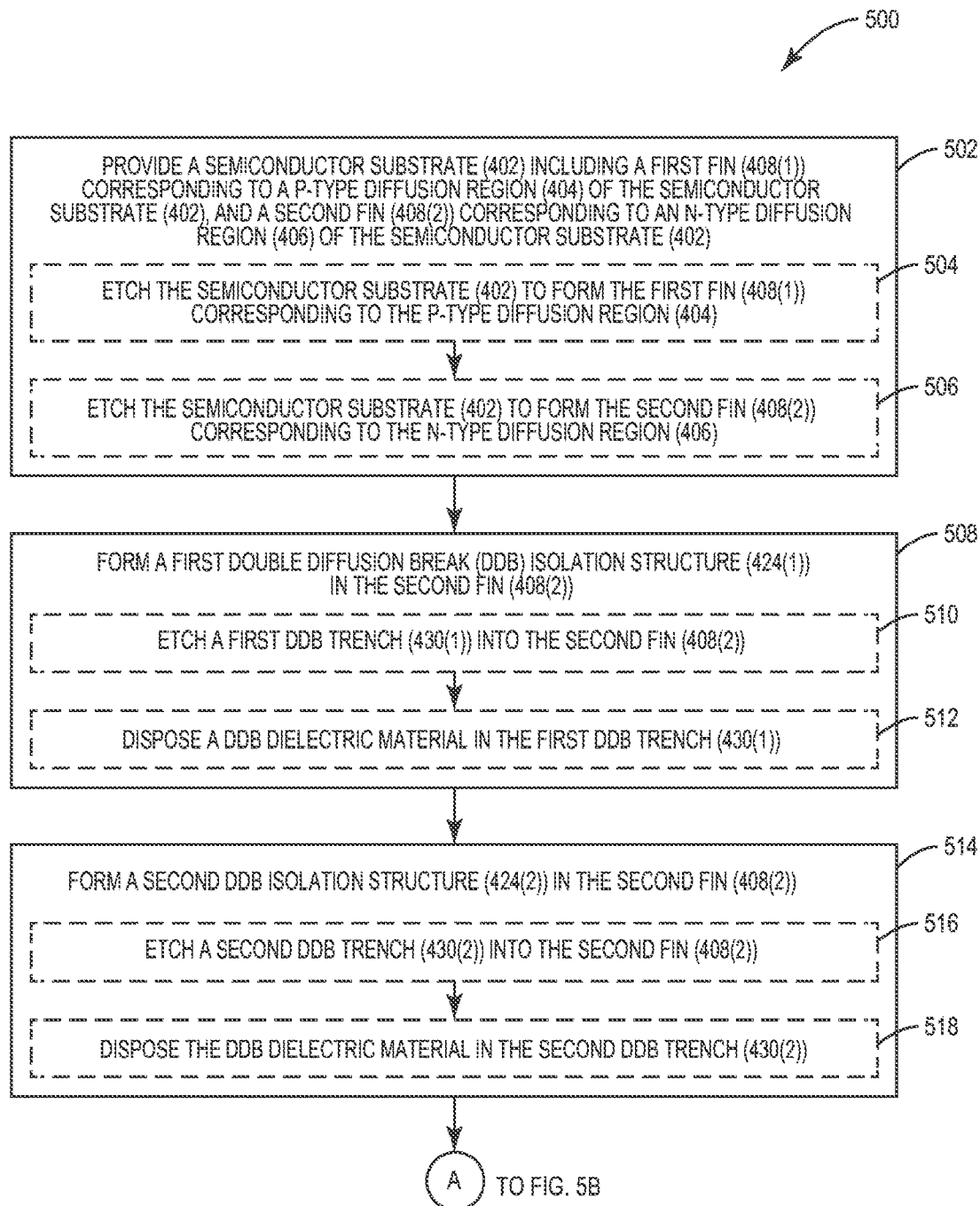
FIGS. 5A-5C illustrate a flowchart illustrating an exemplary process for fabricating the FinFET CMOS circuit employing SDB isolation structures corresponding to P-type FinFETs, and DDB isolation structures corresponding to N-type FinFETs in FIGS. 4A and 4B.
Figure 5B:
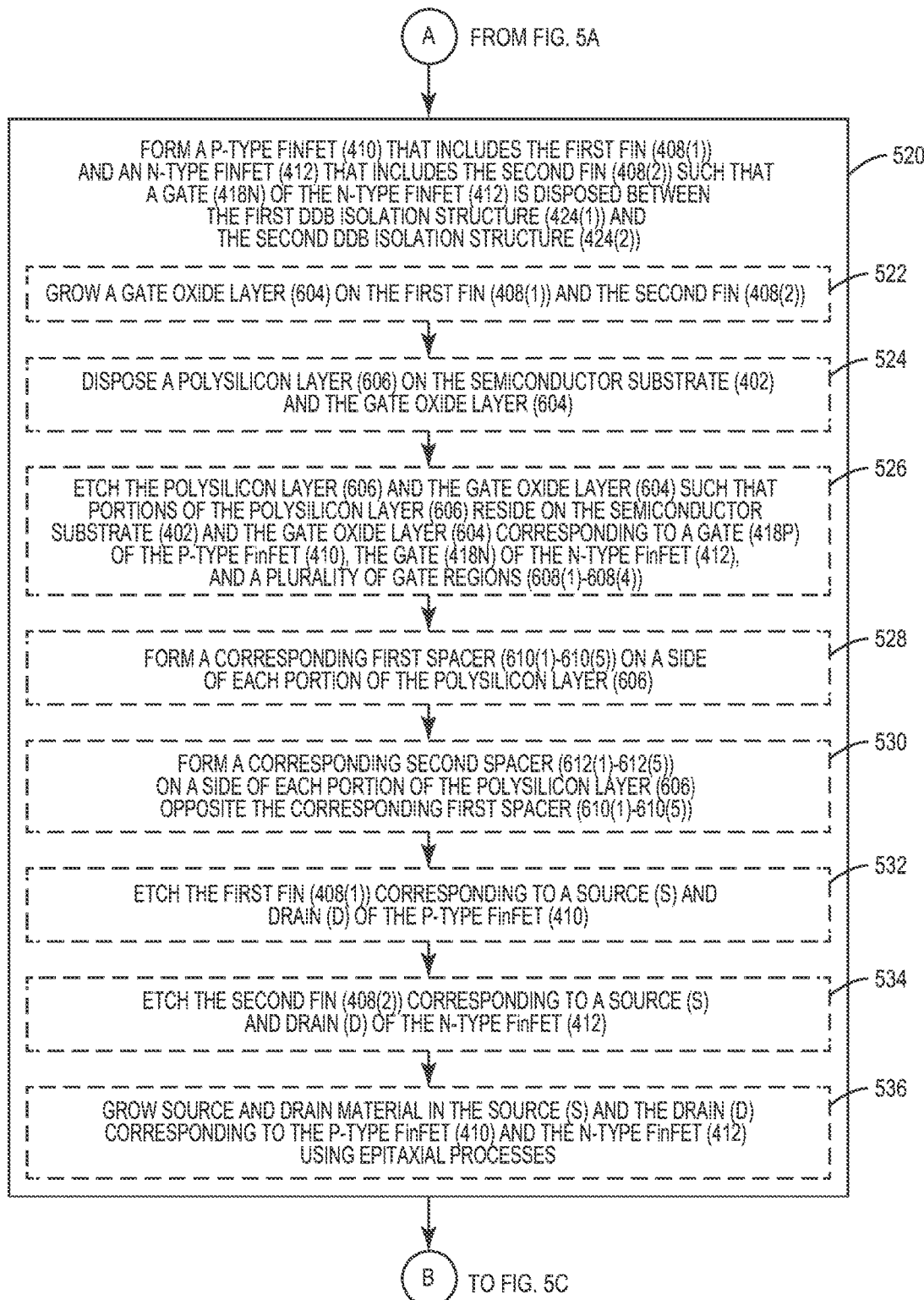
Figure 5C:
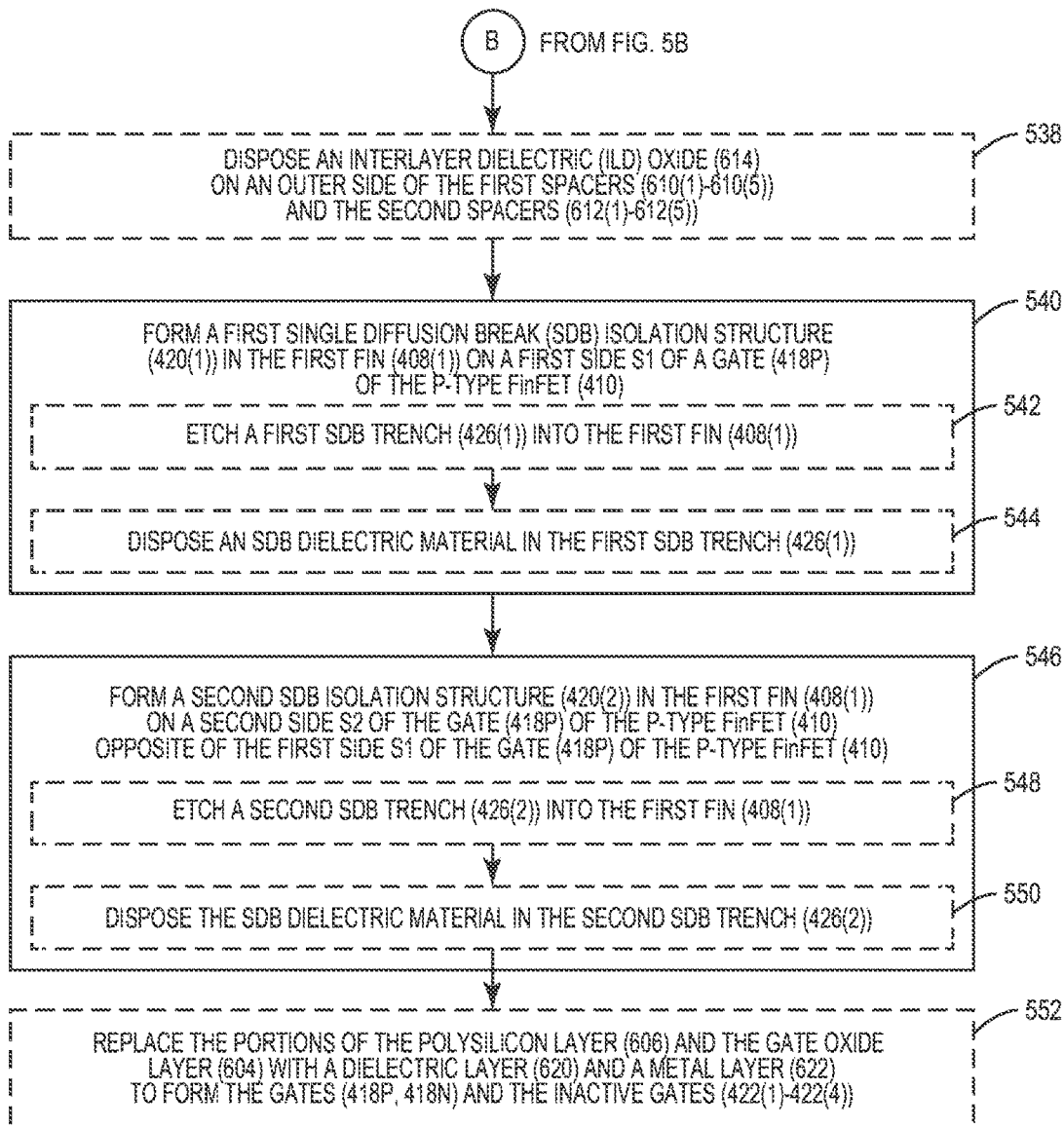

In this regard, FIGS. 5A-5C illustrate an exemplary fabrication process 500 employed to fabricate the FinFET CMOS circuit 400 in FIGS. 4A and 4B. Further, FIGS. 6A-6I provide cross-sectional diagrams illustrating the FinFET CMOS circuit 400 during the various steps of the fabrication process 500. The cross-sectional diagrams illustrating the FinFET CMOS circuit 400 in FIGS. 6A-6I will be discussed in conjunction with the discussion of the exemplary fabrication steps in the fabrication process 500 in FIGS. 5A-5C.

Figure 6B:
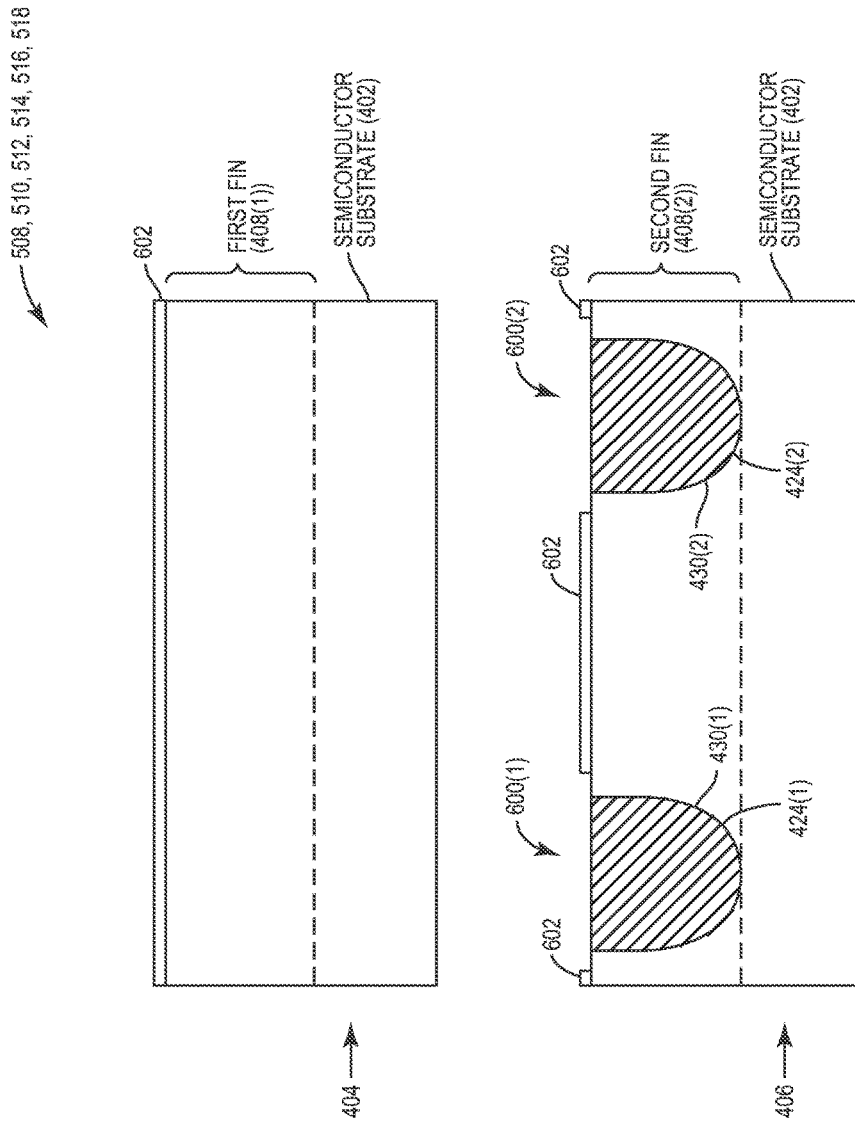
Figure 6E:
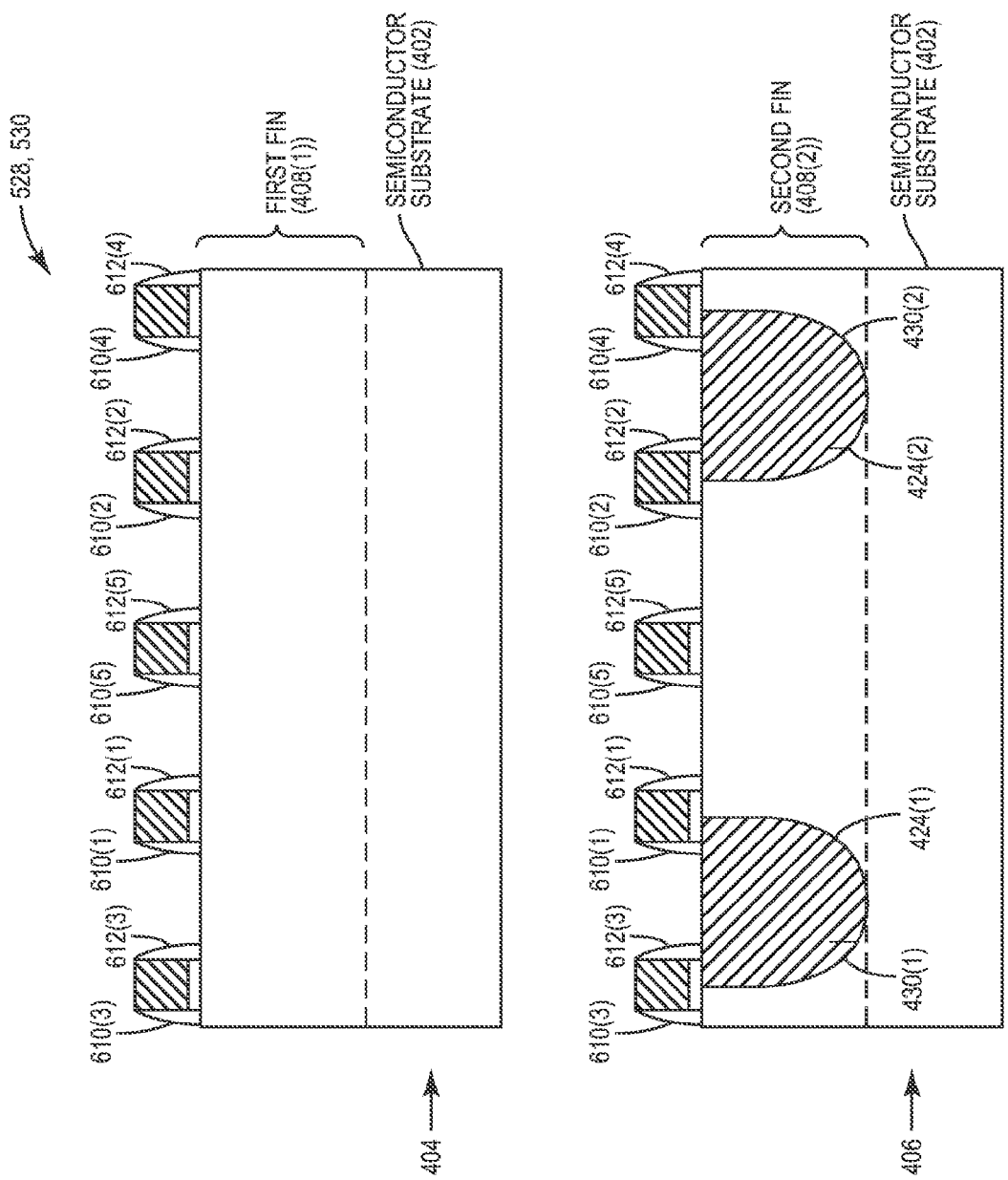
Figure 6F:
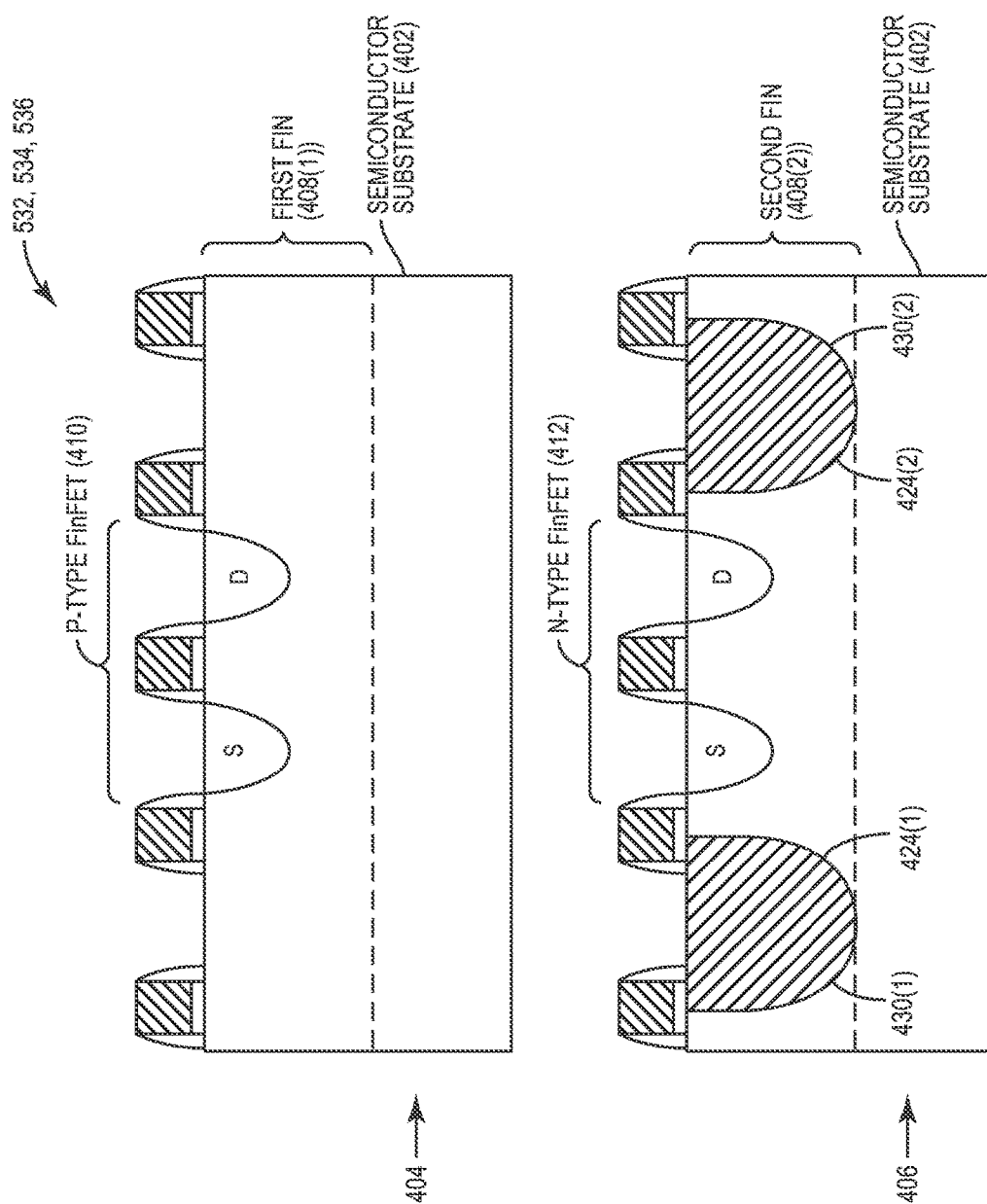

In this regard, the fabrication process 500 beginning in FIG. 5A includes providing the semiconductor substrate 402 that includes the first Fin 408(1) corresponding to the P-type diffusion region 404 of the semiconductor substrate 402, and the second Fin 408(2) corresponding to the N-type diffusion region 406 of the semiconductor substrate 402 (block 502 and FIG. 6A). Providing the semiconductor substrate 402 in block 502 can include etching the semiconductor substrate 402 to form the first Fin 408(1) corresponding to the P-type diffusion region 404 (block 504 and FIG. 6A). Providing the semiconductor substrate 402 in block 502 can also include etching the semiconductor substrate 402 to form the second Fin 408(2) corresponding to the N-type diffusion region 406 (block 506 and FIG. 6A). The fabrication process 500 also includes forming the first DDB isolation structure 424(1) in the second Fin 408(2) (block 508 and FIG. 6B). Forming the first DDB isolation structure 424(1) in block 508 can include etching the first DDB trench 430(1) into the second Fin 408(2) (block 510 and FIG. 6B), and disposing the DDB dielectric material in the first DDB trench 430(1) (block 512 and FIG. 6B). The fabrication process 500 also includes forming the second DDB isolation structure 424(2) in the second Fin 408(2) (block 514 and FIG. 6B). Forming the second DDB isolation structure 424(2) in block 514 can include etching the second DDB trench 430(2) into the second Fin 408(2) (block 516 and FIG. 6B), and disposing the DDB dielectric material in the second DDB trench 430(2) (block 518 and FIG. 6B). For example, as illustrated in FIG. 6B, the first and second DDB isolation structures 424(1), 424(2) can be formed corresponding to openings 600(1), 600(2), respectively, of an oxide hard mask 602, which is removed after forming the first and second DDB isolation structures 424(1), 424(2).

The fabrication process 500 also includes forming the P-type FinFET 410 that includes the first Fin 408(1) and the N-type FinFET 412 that includes the second Fin 408(2) such that the gate 418N of the N-type FinFET 412 is disposed between the first DDB isolation structure 424(1) and the second DDB isolation structure 424(2) (block 520 and FIGS. 6C-6F). In this aspect, the N-type FinFET 412 is formed in block 520 such that the first side S1 of the gate 418N of the N-type FinFET 412 is the second defined distance (e.g., MDD) from the first DDB isolation structure 424(1), and the second side S2 of the gate 418N opposite of the first side S1 of the gate 418N is the second defined distance (e.g., MDD) from the second DDB isolation structure 424(2). Additionally, forming the P-type and N-type FinFETs 410, 412 in block 520 can include multiple steps. For example, block 520 can include growing a gate oxide layer 604 on the first Fin 408(1) and the second Fin 408(2) (block 522 and FIG. 6C). Block 520 can also include disposing a polysilicon layer 606 on the semiconductor substrate 402 and the gate oxide layer 604 (block 524 and FIG. 6C). Block 520 can also include etching the polysilicon layer 606 and the gate oxide layer 604 such that portions of the polysilicon layer 606 reside on the semiconductor substrate 402 and the gate oxide layer 604 corresponding to the gate 418P of the P-type FinFET 410, the gate 418N of the N-type FinFET 412, and gate regions 608(1)-608(4) (block 526 and FIG. 6D). Block 520 can also include forming a corresponding first spacer 610(1)-610(5) on a side of each portion of the polysilicon layer 606 (block 528 and FIG. 6E). Block 520 can also include forming a corresponding second spacer 612(1)-612(5) on a side of each portion of the polysilicon layer 606 opposite of the corresponding first spacer 610(1)-610(5) (block 530 and FIG. 6E). Block 520 can also include etching the first Fin 408(1) corresponding to the source S and drain D of the P-type FinFET 410 (block 532 and FIG. 6F). Block 520 can also include etching the second Fin 408(2) corresponding to the source S and drain D of the N-type FinFET 412 (block 534 and FIG. 6F). Further, block 502 can include growing source and drain material in the source S and drain D corresponding to the P-type FinFET 410 and the N-type FinFET 412 using epitaxial processes (block 536 and FIG. 6F).

Figure 6G:
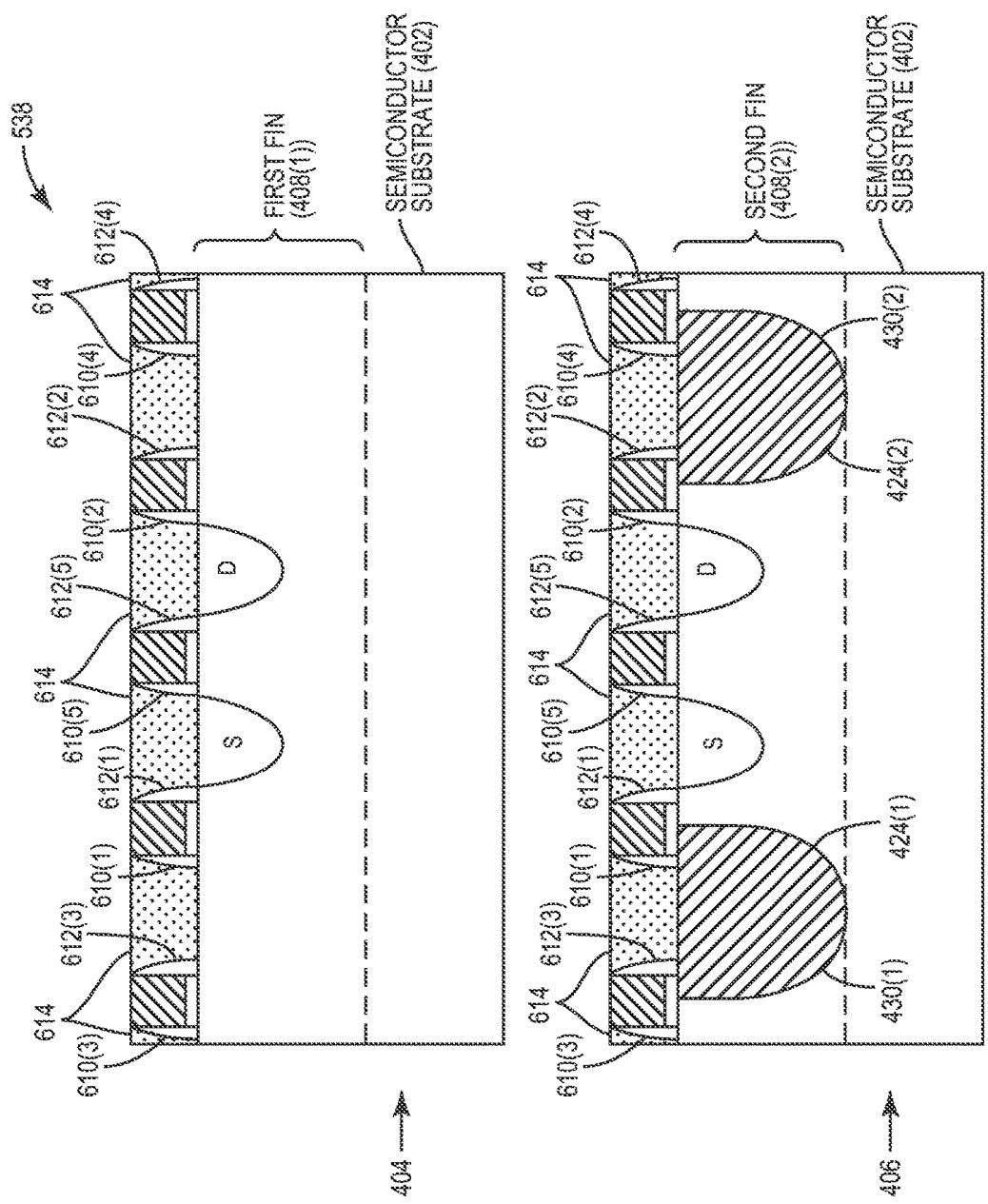
Figure 6H:
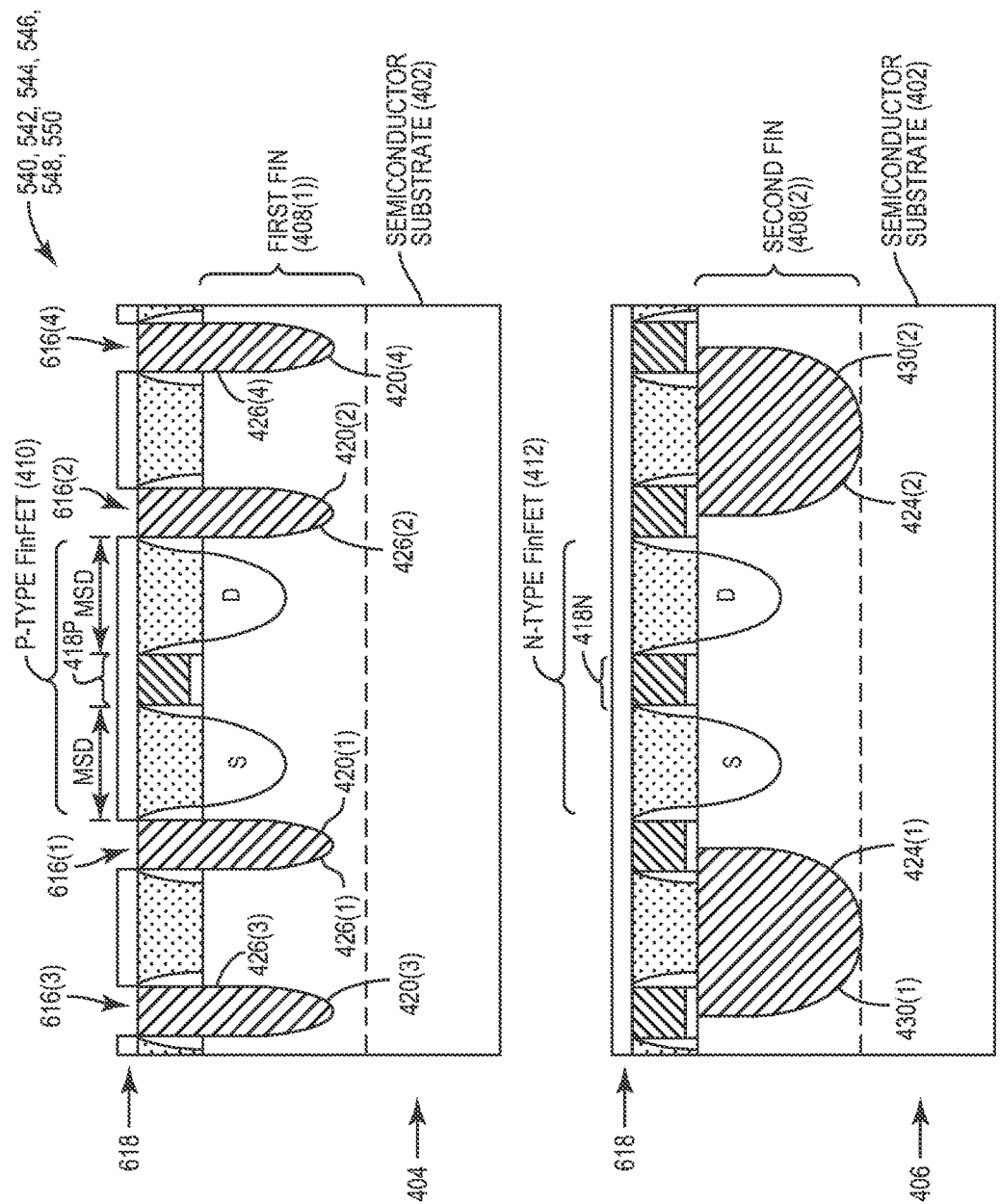
Figure 6I:
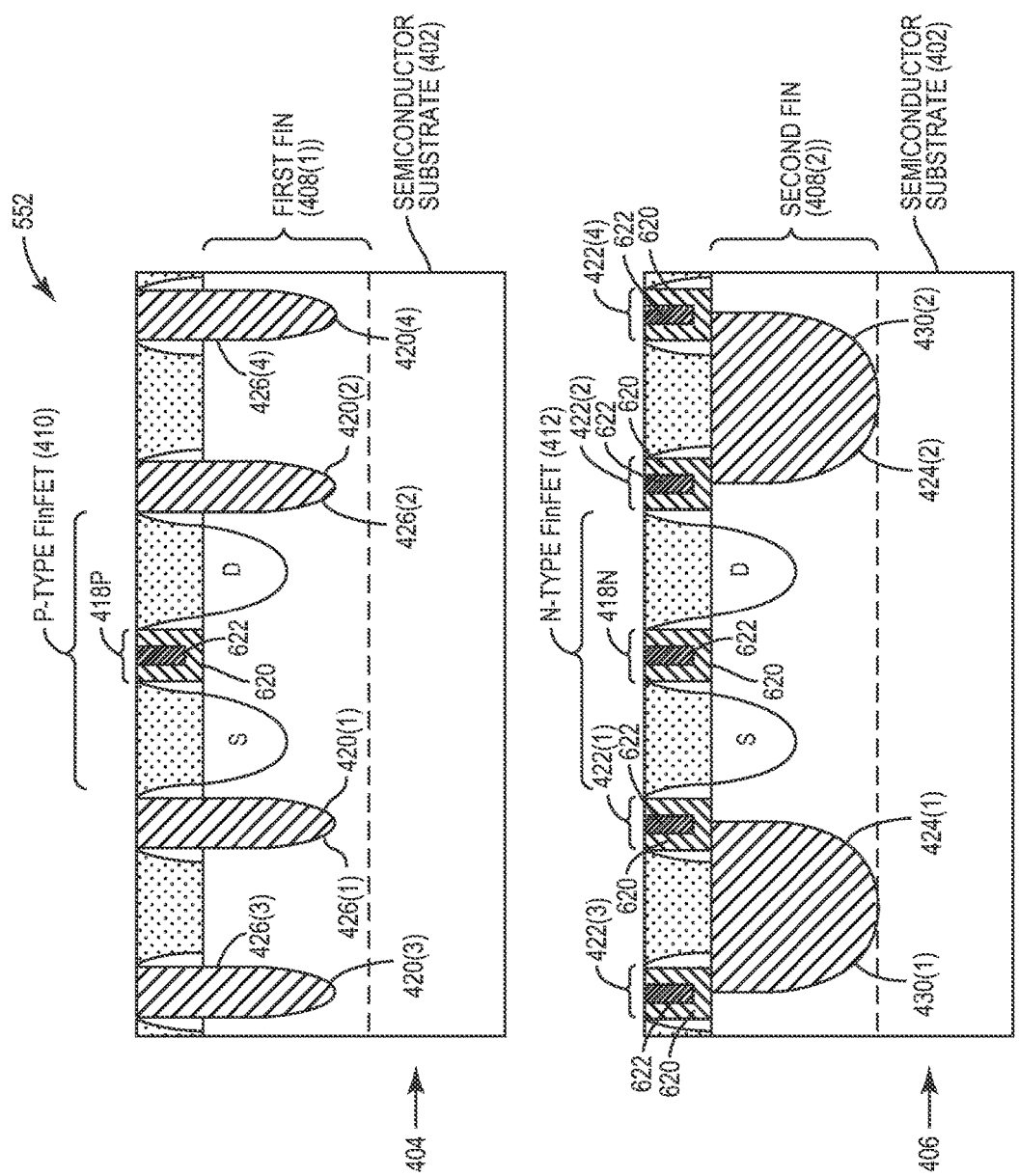

The fabrication process 500 can also include disposing an interlayer dielectric (ILD) oxide 614 on an outer side of the first spacers 610(1)-610(5) and the second spacers 612(1)-612(5) (block 538 and FIG. 6G). The fabrication process 500 also includes forming the first SDB isolation structure 420(1) in the first Fin 408(1) on the first side S1 of the gate 418P of the P-type FinFET 410 (block 540 and FIG. 6H). In this aspect, the first SDB isolation structure 420(1) is formed in block 540 the first defined distance (e.g., MSD) from the first side S1 of the gate 418P of the P-type FinFET 410. Additionally, block 540 can include etching the first SDB trench 426(1) into the first Fin 408(1) of the semiconductor substrate 402 (block 542 and FIG. 6H), and disposing the SDB dielectric material in the first SDB trench 426(1) (block 544 and FIG. 6H). The fabrication process 500 also includes forming the second SDB isolation structure 420(2) in the first Fin 408(1) on the second side S2 of the gate 418P of the P-type FinFET 410 opposite of the first side S1 of the gate 418P (block 546 and FIG. 6H). In this aspect, the second SDB isolation structure 420(2) is formed in block 546 the first defined distance (e.g., MSD) from the second side S2 of the gate 418P of the P-type FinFET 410 opposite of the first side S1 of the gate 418P. Additionally, block 546 can include etching the second SDB trench 426(2) into the first Fin 408(1) of the semiconductor substrate 402 (block 548 and FIG. 6H), and disposing the SDB dielectric material in the second SDB trench 426(2) (block 550 and FIG. 6H). Similar steps can be completed to form the third and fourth SDB isolation structures 420(3), 420(4). Further, in this example, the first, second, third, and fourth SDB isolation structures 420(1)-420(4) can be formed according to corresponding openings 616(1)-616(4) of an oxide hard mask layer 618. The fabrication process 500 can include replacing the portions of the polysilicon layer 606 and the gate oxide layer 604 with a dielectric layer 620 and a metal layer 622 to form the gates 418P, 418N, and the inactive gates 422(1)-422(4) (block 552 and FIG. 6I). The steps listed in the fabrication process 500 do not involve additional elements, such as additional mask layers, that are not used for fabricating other FinFET-based circuits. In this manner, the FinFET CMOS circuit 400 can be fabricated to achieve increased performance as described above, while avoiding increased fabrication costs and complexity.

Figure 7:
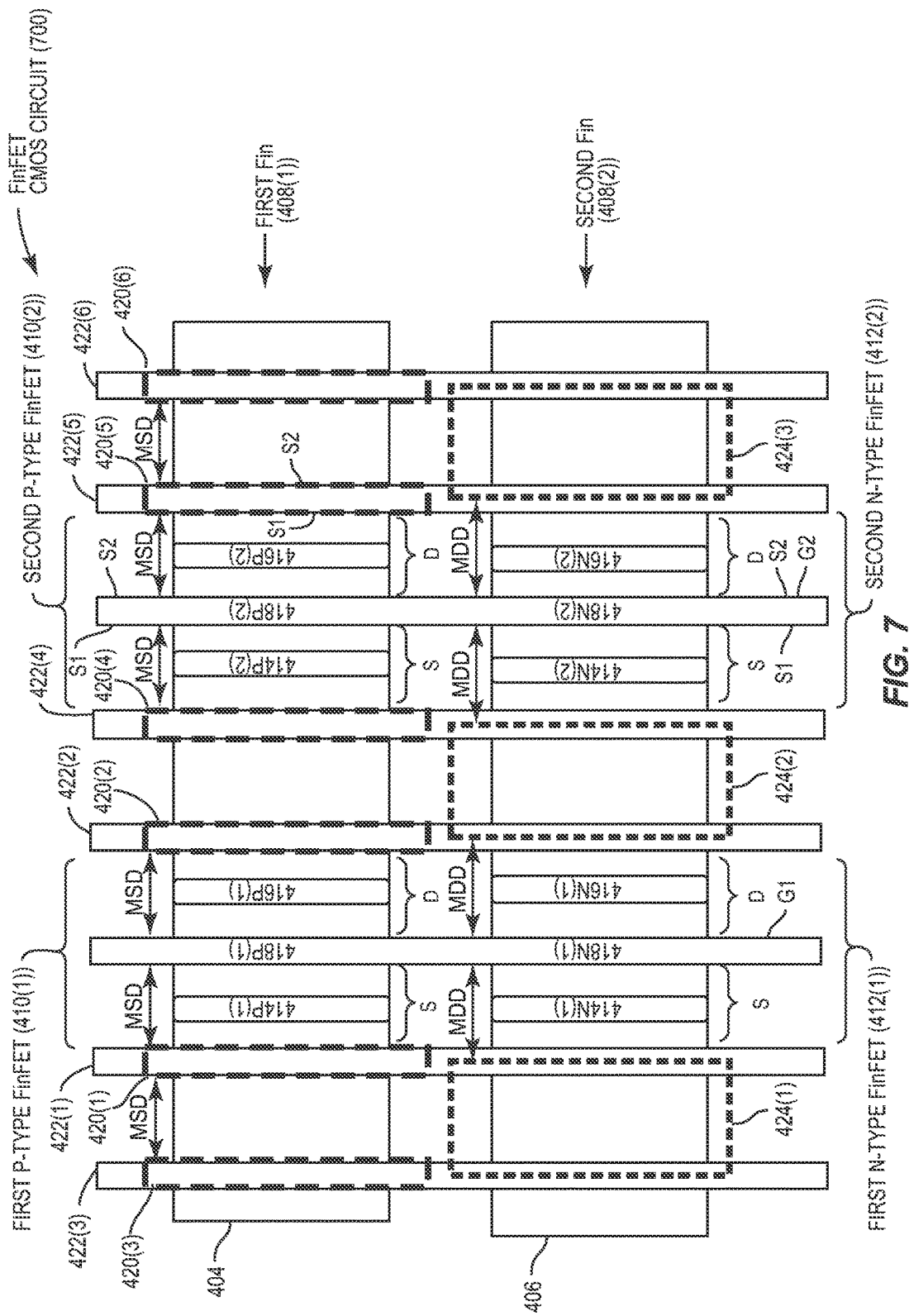
FIG. 7 is a top-view diagram of another exemplary FinFET CMOS circuit employing SDB isolation structures corresponding to P-type FinFETs, and DDB isolation structures corresponding to N-type FinFETs for increased performance.

FIG. 7 illustrates a top-view diagram of another exemplary FinFET CMOS circuit 700 employing single and double diffusion breaks for increased performance. In particular, the FinFET CMOS circuit 700 builds upon the elements of the FinFET CMOS circuit 400 in FIG. 4A. In this manner, the FinFET CMOS circuit 700 includes certain common components with the FinFET CMOS circuit 400 in FIG. 4A as shown by similar element numbers between FIGS. 4A and 7, and thus will not be re-described herein.

With continuing reference to FIG. 7, the FinFET CMOS circuit 700 includes first and second P-type FinFETs 410(1), 410(2) that include the first Fin 408(1), and first and second N-type FinFETs 412(1), 412(2) that include the second Fin 408(2). The first and second P-type FinFETs 410(1), 410(2) include respective source contacts 414P(1), 414P(2) corresponding to each source S, drain contacts 416P(1), 416P(2) corresponding to each drain D, and gates 418P(1), 418P(2). Similarly, the first and second N-type FinFETs 412(1), 412(2) include respective source contacts 414N(1), 414N(2) corresponding to each source S, drain contacts 416N(1), 416N(2) corresponding to each drain D, and gates 418N(1), 418N(2). In this example, the gates 418P(1), 418N(1) correspond to a common gate G1 shared between the first P-type FinFET 410(1) and the first N-type FinFET 412(1). Similarly, the gates 418P(2), 418N(2) correspond to a common gate G2 shared between the second P-type FinFET 410(2) and the second N-type FinFET 412(2).

With continuing reference to FIG. 7, in addition to the first, second, third, and fourth SDB isolation structures 420(1)-420(4), the FinFET CMOS circuit 700 includes fifth and sixth SDB isolation structures 420(5), 420(6) formed in the first Fin 408(1). The fifth SDB isolation structure 420(5) is formed the first defined distance (e.g., MSD) from a second side S2 of the gate 418P(2) of the second P-type FinFET 410(2), wherein the fourth SDB isolation structure 420(4) is formed the first defined distance (e.g., MSD) from a first side S1 of the gate 418P(2) opposite of the second side S2 of the gate 418P(2). The sixth SDB isolation structure 420(6) is formed the first defined distance (e.g., MSD) from a second side S2 of the fifth SDB isolation structure 420(5) opposite of a first side S1 of the fifth SDB isolation structure 420(5) on which the gate 418P(2) is formed. In this manner, the second and fourth SDB isolation structures 420(2), 420(4) electrically isolate the first and second P-type FinFETs 410(1), 410(2), while the fifth and sixth SDB isolation structures 420(5), 420(6) electrically isolate the second P-type FinFET 410(2) from other elements that can be included in the FinFET CMOS circuit 700 in the P-type diffusion region 404.

With continuing reference to FIG. 7, in addition to the first and second DDB isolation structures 424(1), 424(2), a third DDB isolation structure 424(3) is formed in the second Fin 408(2). The third DDB isolation structure 424(3) is formed the second defined distance (e.g., MDD) from the second side S2 of the gate 418N(2) of the second N-type FinFET 412(2), wherein the second DDB isolation structure 424(2) is formed the second defined distance (e.g., MDD) from the first side S1 of the gate 418N(2) opposite of the second side S2 of the gate 418N(2). In this manner, the second DDB isolation structure 424(2) electrically isolates the first and second N-type FinFETs 412(1), 412(2), while the third DDB isolation structure 424(3) electrically isolates the second N-type FinFET 412(2) from other elements that can be included in the FinFET CMOS circuit 700 in the N-type diffusion region 406.

By employing the elements described above, the FinFET CMOS circuit 700 can be the basis for multiple types of circuits. As a non-limiting example, the FinFET CMOS circuit 700 can be employed as a ring oscillator. In particular, one way in which the FinFET CMOS circuit 700 may function as a ring oscillator is by coupling an output of the first P-type FinFET 410(1) to an input of the second P-type FinFET 410(2), and by coupling an output of the first N-type FinFET 412(1) to an input of the second N-type FinFET 412(2). Additional P-type FinFETs 410 and N-type FinFETs 412, along with additional SDB and DDB isolation structures 420, 424, can be added to the FinFET CMOS circuit 700 to create a larger ring oscillator. In this manner, employing hybrid diffusion regions in the FinFET CMOS circuit 700 provides a ring oscillator that can achieve increased performance and minimized area, while also avoiding increased fabrication costs and complexity.

The FinFET CMOS circuits employing single and double diffusion breaks for increased performance according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 8:
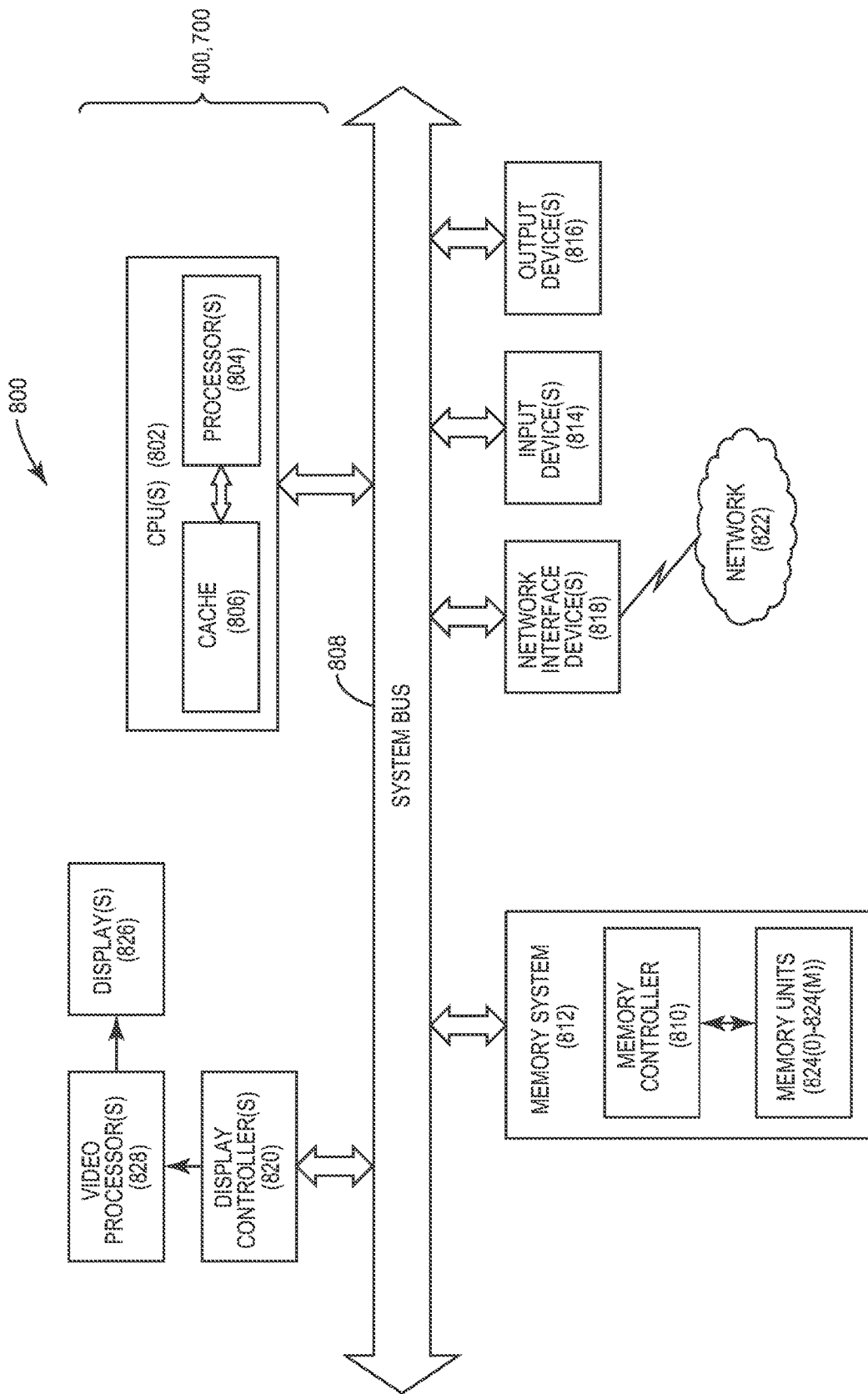
FIG. 8 is a block diagram of an exemplary processor-based system that can include elements employing the FinFET CMOS circuits of FIGS. 4A, 4B, and 7.

In this regard, FIG. 8 illustrates an example of a processor-based system 800 that can employ the FinFET CMOS circuit 400 illustrated in FIGS. 4A, 4B, and/or the FinFET CMOS circuit 700 illustrated in FIG. 7. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any device configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(0)-824(M).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A Fin Field Effect Transistor (FinFET) complementary metal oxide semiconductor (CMOS) circuit, comprising:
   a semiconductor substrate;
   a P-type FinFET comprising a first Fin formed from the semiconductor substrate and corresponding to a P-type semiconductor material (P-type) diffusion region;
   an N-type FinFET comprising a second Fin formed from the semiconductor substrate and corresponding to an N-type semiconductor material (N-type) diffusion region;
   a first single diffusion break (SDB) isolation structure formed in the first Fin on a first side of a gate of the P-type FinFET;
   a second SDB isolation structure formed in the first Fin on a second side of the gate of the P-type FinFET opposite of the first side of the gate of the P-type FinFET;
   a first double diffusion break (DDB) isolation structure formed in the second Fin on a first side of a gate of the N-type FinFET; and
   a second DDB isolation structure formed in the second Fin on a second side of the gate of the N-type FinFET opposite of the first side of the gate of the N-type FinFET,
   wherein the first SDB isolation structure and the second SDB isolation structure each have a width approximately equal to a gate length of the P-type FinFET and wherein the first DDB isolation structure and the second DDB isolation structure each have a width approximately equal to a gate pitch of the FinFET CMOS circuit.

2. The FinFET CMOS circuit of claim 1, wherein:
   the first SDB isolation structure is formed in the first Fin a first defined distance from the first side of the gate of the P-type FinFET;
   the second SDB isolation structure is formed in the first Fin the first defined distance from the second side of the gate of the P-type FinFET;
   the first DDB isolation structure is formed in the second Fin a second defined distance from the first side of the gate of the N-type FinFET, wherein the second defined distance is different than the first defined distance; and
   the second DDB isolation structure is formed in the second Fin the second defined distance from the second side of the gate of the N-type FinFET.

3. The FinFET CMOS circuit of claim 2, wherein:
   the first defined distance comprises a minimum SDB distance; and
   the second defined distance comprises a minimum DDB distance.

4. The FinFET CMOS circuit of claim 3, wherein:
   the gate length of the P-type FinFET is approximately equal to twenty (20) nm; and
   a gate length of the N-type FinFET is approximately equal to 20 nm.

5. The FinFET CMOS circuit of claim 4, wherein:
   the first defined distance comprises the minimum SDB distance approximately equal to forty-four (44) nanometers (nm); and
   the second defined distance comprises the minimum DDB distance approximately equal to fifty-four (54) nm.

6. The FinFET CMOS circuit of claim 1, wherein:
   the first SDB isolation structure comprises:
      a first SDB trench etched into the first Fin; and
      an SDB dielectric material disposed in the first SDB trench; and
   the second SDB isolation structure comprises:
      a second SDB trench etched into the first Fin; and
      the SDB dielectric material disposed in the second SDB trench.

7. The FinFET CMOS circuit of claim 6, wherein the SDB dielectric material disposed in the first SDB trench and the second SDB trench comprises silicon dioxide.

8. The FinFET CMOS circuit of claim 1, wherein:
   the first DDB isolation structure comprises:
      a first DDB trench etched into the second Fin: and
      a DDB dielectric material disposed in the first DDB trench; and
   the second DDB isolation structure comprises:
      a second DDB trench etched into the second Fin; and
      the DDB dielectric material disposed in the second DDB trench.

9. The FinFET CMOS circuit of claim 8, wherein the DDB dielectric material disposed in the first DDB trench and the second DDB trench comprises silicon dioxide.

10. The FinFET CMOS circuit of claim 1, further comprising:
    a third SDB isolation structure formed in the first Fin on a first side of the first SDB isolation structure opposite of a second side of the first SDB isolation structure on which the gate of the P-type FinFET is formed; and
    a fourth SDB isolation structure formed in the first Fin on a second side of the second SDB isolation structure opposite of a first side of the second SDB isolation structure on which the gate of the P-type FinFET is formed.

11. The FinFET CMOS circuit of claim 10, further comprising:
    a second P-type FinFET comprising the first Fin;
    a second N-type FinFET comprising the second Fin;
    a fifth SDB isolation structure formed in the first Fin on a second side of a gate of the second P-type FinFET, wherein the fourth SDB isolation structure is on a first side of the gate of the second P-type FinFET opposite of the second side of the gate of the second P-type FinFET;
    a sixth SDB isolation structure formed in the first Fin on a second side of the fifth SDB isolation structure opposite of a first side of the fifth SDB isolation structure on which the gate of the second P-type FinFET is formed; and
    a third DDB isolation structure formed in the second Fin on a second side of a gate of the second N-type FinFET, wherein the second DDB isolation structure is on a first side of the gate of the second N-type FinFET opposite of the second side of the gate of the second N-type FinFET.

12. The FinFET CMOS circuit of claim 1 integrated into an integrated circuit (IC).

13. The FinFET CMOS circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *